US012621980B2

(12) United States Patent
Hao

(10) Patent No.: US 12,621,980 B2
(45) Date of Patent: May 5, 2026

(54) SEMICONDUCTOR DEVICE HAVING GATE STRUCTURE AND METHOD FOR MANUFACTURING THE SAME

(71) Applicant: NANYA TECHNOLOGY CORPORATION, New Taipei City (TW)

(72) Inventor: Chung-Peng Hao, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 426 days.

(21) Appl. No.: 18/368,678

(22) Filed: Sep. 15, 2023

(65) Prior Publication Data

US 2024/0090195 A1 Mar. 14, 2024

Related U.S. Application Data

(62) Division of application No. 17/940,365, filed on Sep. 8, 2022.

(51) Int. Cl.
H10B 12/00 (2023.01)

(52) U.S. Cl.
CPC ............. H10B 12/30 (2023.02); H10B 12/05 (2023.02); H10B 12/482 (2023.02)

(58) Field of Classification Search
CPC ...... H10B 12/30; H10B 12/05; H10B 12/482; H10B 12/488; H10B 10/00; H10B 12/02; H10B 12/03; H10B 41/35; H10B 43/35; H01L 21/76838; H01L 23/5283
See application file for complete search history.

(56) References Cited

U.S. PATENT DOCUMENTS

| | | | |
|---|---|---|---|
| 2019/0043865 A1* | 2/2019 | Chang | H10B 12/488 |
| 2023/0048424 A1* | 2/2023 | Kim | H10D 30/6757 |

FOREIGN PATENT DOCUMENTS

| | | |
|---|---|---|
| TW | 202010095 A | 3/2020 |
| TW | 202042118 A | 11/2020 |
| TW | 202111933 A | 3/2021 |

(Continued)

OTHER PUBLICATIONS

Office Action and Search Report mailed on Jul. 2, 2024 related to Taiwanese Application No. 112147061.

(Continued)

*Primary Examiner* — Mohammed R Alam
(74) *Attorney, Agent, or Firm* — Xuan Zhang

(57) ABSTRACT

A semiconductor device and a method of manufacturing a semiconductor device are provided. The semiconductor device includes a first bit-line extending in a first direction and a first word-line extending in a second direction substantially perpendicular to the first direction. The semiconductor device also includes a first channel. The first bit-line and the first word-line are electrically coupled to the first channel. The semiconductor device also includes a first gate line disposed between the first bit-line and the first word-line. The first gate line is electrically coupled to the first channel and configured to close the first channel once the first bit-line and the first word-line are shorted together through the first channel.

9 Claims, 23 Drawing Sheets

1a

(56)                    References Cited

FOREIGN PATENT DOCUMENTS

TW          202412281  A      3/2024

OTHER PUBLICATIONS

Office Action and Search Report mailed on Feb. 16, 2024 related to Taiwanese Application No. 112113446.
Office Action and Search Report mailed on Oct. 1, 2025 related to U.S. Appl. No. 17/940,365, wherein this application is a Div of U.S. Appl. No. 17/940,365.

* cited by examiner

Providing a substrate ⟨S41

Forming a gate stack having a gate line and a word-line on the substrate ⟨S42

Forming a channel in the gate stack ⟨S43

Forming a bit-line over the gate line ⟨S44

Close the channel once the channel and the word-line are shorted together through the channel ⟨S45

40

SEMICONDUCTOR DEVICE HAVING GATE STRUCTURE AND METHOD FOR MANUFACTURING THE SAME

CROSS-REFERENCE TO RELATED APPLICATION

This application is a divisional application of U.S. Non-Provisional application Ser. No. 17/940,365 filed Sep. 8, 2022, which is incorporated herein by reference in its entirety.

TECHNICAL FIELD

The present disclosure relates to a semiconductor device having a gate line and a method for manufacturing the same, and more particularly, to a gate line electrically coupled to a channel of an access transistor.

DISCUSSION OF THE BACKGROUND

A memory array includes memory cells, each of which has a storage capacitor and an access transistor. The drain of the access transistor may be connected to a bit-line and the source of the access transistor may be connected to a node of the storage capacitor. The gate (which is also known as a word-line) of the access transistor may function as a switch to control a channel of the access transistor between the source and the drain.

The channel may be formed by, for example, defining a hole through layers using photolithography and etching and then filling the hole with appropriate materials. As memory cell density increases and critical dimensions decreases the aspect ratio of such channels continues to increase.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a first bit-line extending in a first direction and a first word-line extending in a second direction substantially perpendicular to the first direction. The semiconductor device also includes a first channel. The first bit-line and the first word-line are electrically coupled to the first channel. The semiconductor device also includes a first gate line disposed between the first bit-line and the first word-line. The first gate line is electrically coupled to the first channel and configured to close the first channel once the first bit-line and the first word-line are shorted together through the first channel.

Another aspect of the present disclosure provides a semiconductor device. The semiconductor device includes a first bit-line extending in a first direction and a first gate line extending in a second direction substantially perpendicular to the first direction. The semiconductor device also includes a second gate line extending in the second direction. The semiconductor device also includes a first channel disposed between the first gate line and the second gate line. The first gate line is electrically coupled to the first channel and configured to close the first channel once the first bit-line and the first word-line are shorted together through the first channel.

Another aspect of the present disclosure provides a method of manufacturing a semiconductor device. The method includes providing a substrate and forming a first gate stack on the substrate. The first gate stack includes a first word-line and a first gate line over the first word-line. The method also includes forming a first channel in the first gate stack and forming a bit-line over the first gate line.

By using a gate line disposed between a word-line and a bit-line, a control voltage may be supplied to one or more access transistors for closing channel(s) of the one or more access transistors once a short-circuit occurs between the bit-line and the word-line through the channel(s).

Therefore, the functions of the other channels connected by the bit-line may not be affected. More channels may be activated by a single bit-line. The effective read/write performance of the semiconductor device can be increased by allowing more data to be written to/read from the semiconductor device during a single operation.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
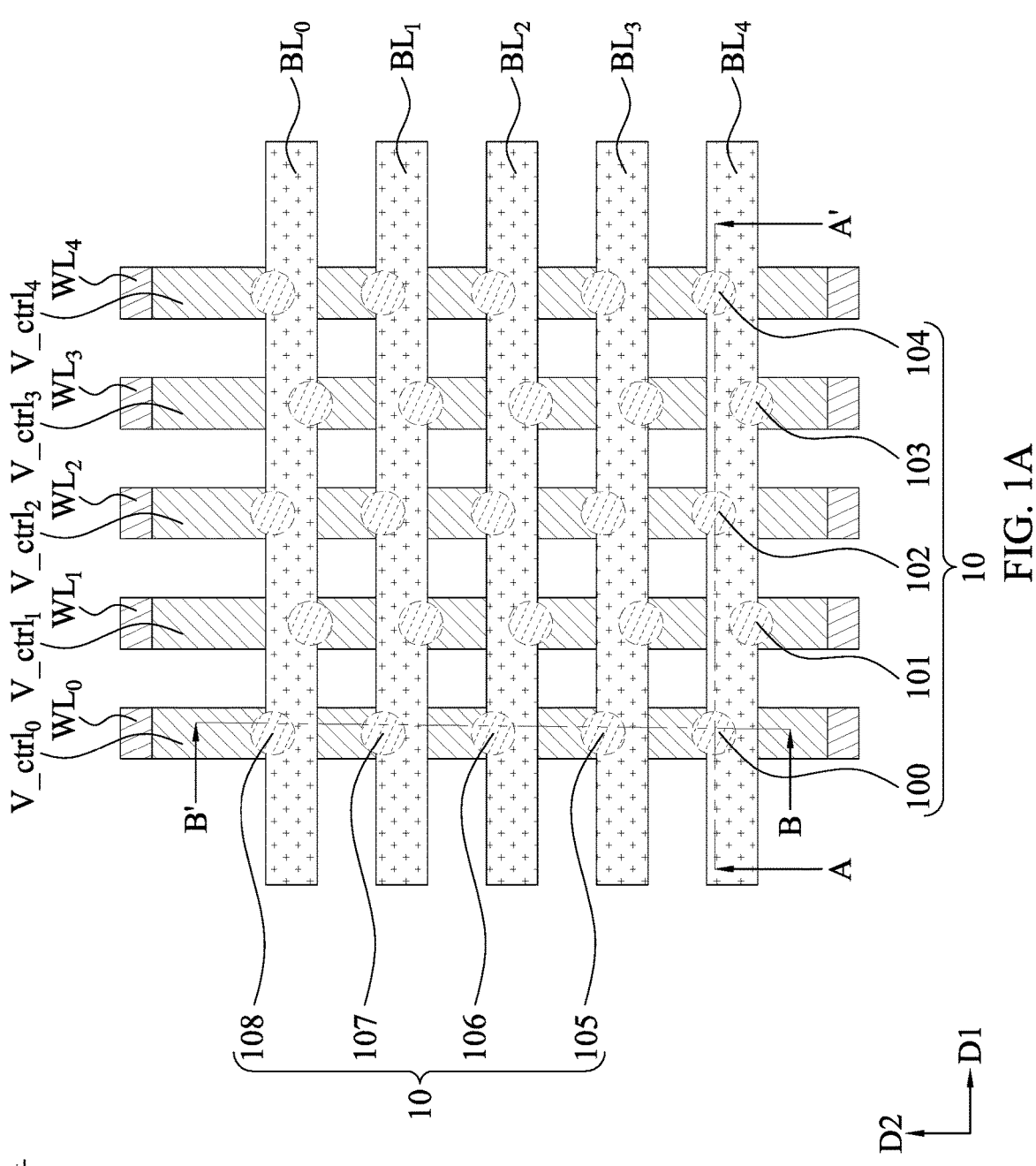
FIG. 1A is a schematic top view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a schematic top view of a semiconductor device 1 in accordance with some embodiments of the present disclosure.

In some embodiments, the semiconductor device 1 may include a volatile memory device or a nonvolatile memory device, such as a dynamic random-access memory (DRAM), an electrically erasable programmable read-only memory (EEPROM), a NAND flash memory, and an oxide semiconductor RAM (OSRAM), etc.

As shown in FIG. 1A, in some embodiments, the semiconductor device 1 may include channels 100, 101, 102, 103, 104, 105, 106, 107, 108 (collectively referred to as channels 10), bit-lines $BL_0$, $BL_1$, $BL_2$, $BL_3$, $BL_4$ (collectively referred to as bit-lines "BL"), word-lines $WL_0$, $WL_1$, $WL_2$, $WL_3$, $WL_4$ (collectively referred to as word-lines "WL"), and gate lines $V\_ctrl_0$, $V\_ctrl_1$, $V\_ctrl_2$, $V\_ctrl_3$, $V\_ctrl_4$ (collectively referred to as gate lines "V_ctrl").

The bit-lines BL may each include a portion having a strip shape (such as a longitudinal portion) extending in or along a direction (or an orientation) D1. The bit-lines BL may each be electrically coupled to one or more of the channels 10. For example, the $BL_4$ may be electrically coupled to the channels 100, 101, 102, 103, and 104.

The word-lines WL may each include a portion having a strip shape (such as a longitudinal portion) extending in or along a direction (or an orientation) D2 substantially perpendicular to the direction D1. The word-lines WL may each be electrically coupled to one or more of the channels 10. For example, the $WL_0$ may be electrically coupled to the channels 100, 105, 106, 107, and 108.

The gate lines V_ctrl may each include a portion having a strip shape (such as a longitudinal portion) extending in or along the direction D2. The gate lines V_ctrl may each be electrically coupled to one or more of the channels 10. For example, the gate lines $V\_ctrl_0$ may be electrically coupled to the channels 100, 105, 106, 107, and 108.

The word-lines WL and the gate lines V_ctrl may overlap. The word-lines WL may be covered or blocked by the gate lines V_ctrl from a top view.

The channels 10 may be arranged in an array. The channels 10 may be aligned along the direction D2. For example, the channels 10 may be arranged in a straight line along the direction D2.

The channels 10 may not be aligned along the direction D1. For example, the channels 10 may be alternatingly offset along the direction D1. For example, the channels 10 may not entirely overlap with the bit-lines BL. For example, the channels 10 may be offset from central lines of the bit-lines BL. For example, each of the channels 10 may be offset in an alternating fashion so that each of the channels 10 may be offset from both of its immediate neighbors.

For example, the channel 100 may be closer to a side of the bit-line $BL_4$ and the adjacent channel 101 may be closer to another side of the bit-line $BL_4$. For example, the channel 100 may have a portion uncovered by the bit-line $BL_4$. For example, the channel 100 may have a portion protruding from a side of the bit-line $BL_4$.

In some embodiments, to miniature the channel critical dimension, the channels may be fabricated by double patterning process. The alternating offset arrangement may help increase the memory cell density and increase the speed of the semiconductor device 1. In some embodiments, the semiconductor device 1 may include a memory array having memory cells. Memory cells may include data cells and dummy cells.

The data cells may be configured or used for normal (or regular) storage operations. For example, the data cells may store either a logic low value (e.g., 0) or a logic high value (e.g., 1).

The dummy cells may be disposed adjacent to the data cells or on a margin of the memory array. In some embodiments, the dummy cells may not be configured or used for normal (or regular) storage operations.

The logic values read from the data cells may be validated when the logic values read from corresponding dummy cells are accurate. On the other hand, the logic values read from the data cells may be invalidated when the logic values read from corresponding dummy cells are inaccurate. Therefore, the dummy cells can protect the data cells and increase the reliability of the semiconductor device 1.

In some embodiments, a data cell or a dummy cell may include a storage capacitor and an access transistor (such as an oxide semiconductor FET). An access transistor may have a drain contact, a source contact, a gate, and a channel. The drain contact of the access transistor may be connected to a bit-line and the source contact of the access transistor may be connected to a node of the storage capacitor. The gate (also referred to as the word-line) of the access transistor may function as a switch to control the channel of the access transistor. In some embodiments, the bit-lines BL and the word-lines WL may be configured to address the access transistor.

In some embodiments, the bit-lines BL may include dummy bit-lines configured to supply test signals to the drain contacts of the access transistors.

For example, the bit-line $BL_4$ may be configured to supply test signals to the channels 100, 101, 102, 103, and 104.

In some embodiments, the word-lines WL may include dummy word-lines configured to activate testing by turning on the access transistors or opening the channels.

For example, the word-line $WL_0$ may open or initiate the channel 100 (and other channels 105, 106, 107, and 108 electrically coupled to the word-line $WL_0$). For example, the word-line $WL_1$ may open the channel 101 (and other channels electrically coupled to the word-line $WL_1$). For example, the word-line $WL_2$ may open the channel 102 (and other channels electrically coupled to the word-line $WL_2$). For example, the word-line $WL_3$ may open the channel 103 (and other channels electrically coupled to the word-line $WL_3$). For example, the word-line $WL_4$ may open the channel 104 (and other channels electrically coupled to the word-line $WL_4$).

Figure 1B:
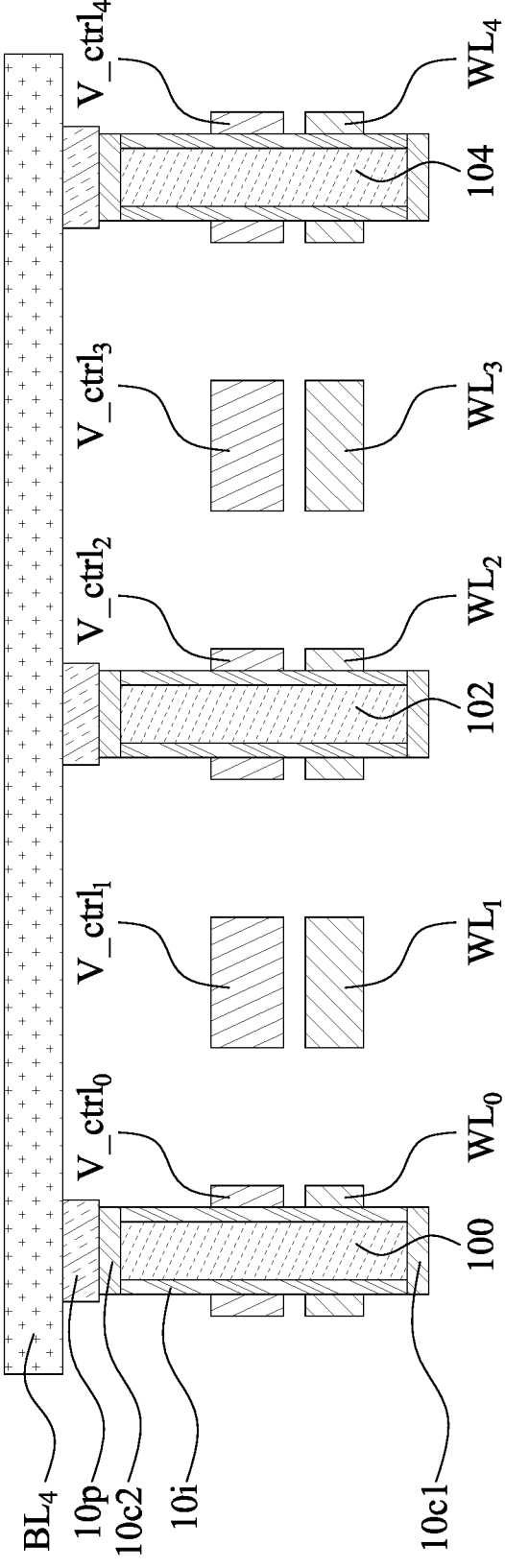
FIG. 1B is a schematic cross-sectional view of a semiconductor device in accordance with some embodiments of the present disclosure.

FIG. 1B is a schematic cross-sectional view of a semiconductor device 1a in accordance with some embodiments of the present disclosure. In some embodiments, the semiconductor device 1a of FIG. 1B may be a schematic cross-sectional view along line AA' in FIG. 1A.

The semiconductor device 1a may include the channels 100, 102, and 104, the bit-line $BL_4$, the word-lines WL, the gate lines V_ctrl, electrical contacts 10c1, 10c2, a dielectric layer 10i, and a landing pad 10p.

It is noted that some elements of the semiconductor device 1a are not illustrated in FIG. 1B for conciseness and clearness. More detailed structure is illustrated in FIG. 1G and will be described with reference to FIG. 1G.

The channel 100 may have be columnar, tubular, or cylindrical. In some embodiments, the channel 100 may be substantially perpendicular to a major surface of a substrate (such as a substrate 11 in FIG. 1G). In some embodiments, an end of the channel 100 may be electrically connected to the bit-line $BL_4$ and another end of the channel 100 may be electrically connected to a node or a terminal of a storage capacitor (nor shown in the figures).

In some embodiments, the channel 100 may include a solid channel filled with a material to connect the bit-line $BL_4$ and the storage capacitor. In some embodiments, the channel material may include indium gallium zinc oxide (IGZO) or other appropriate semiconducting material. In some embodiments, the channel 100 may be formed by filling openings through an atomic layer deposition (ALD) or plasma enhanced chemical vapor deposition (PECVD). In some embodiments, the channel 100 may be formed by using vapor phase epitaxial growth to grow mono-crystalline silicon from the bottom of the vertically-oriented channel upwards to the top of the vertically-oriented channel. In some embodiments, the channel 100 may be formed by recrystallizing an initially deposited amorphous semiconductor material.

In some embodiments, the electrical contact 10c1 may be disposed below the channel 100. In some embodiments, the electrical contact 10c1 may include indium tin oxide (ITO), indium-doped zinc oxide (IZO), indium-doped cadmium oxide (ICdO or CdO:In), aluminum-doped zinc oxide (AZO), gallium-doped zinc oxide (GZO), tungsten/titanium nitride (W/TiN), or other.

In some embodiments, the electrical contact 10c1 may include a source contact. In some embodiments, the electrical contact 10c1 may be configured to electrically couple to a reference potential ground (GND). In some embodiments, the electrical contact 10c1 may be configured to electrically couple to a node of a storage capacitor (nor shown in the figures).

In some embodiments, the dielectric layer 10i may surround or cover the channel 100. In some embodiments, the dielectric layer 10i may include a dielectric material, such as silicon oxide ($SiO_2$), silicon nitride ($Si_3N_4$), silicon oxynitride (SiON), and silicon nitride oxide ($N_2OSi_2$), other high-k insulating materials, or any electrically insulating material.

In some embodiments, the electrical contact 10c2 may be disposed on or over the channel 100. In some embodiments, the electrical contact 10c2 may include a material as listed here for the electrical contact 10c1.

In some embodiments, the electrical contact 10c2 may include a drain contact. In some embodiments, the electrical contact 10c2 may be configured to electrically couple to the bit-line $BL_4$ through the landing pad 10p.

In some embodiments, the landing pad 10p may be disposed on or over the electrical contact 10c2. In some embodiments, the landing pad 10p may include tungsten (W), a polysilicon (poly-Si), or combinations thereof. In some embodiments, the landing pad 10p may be configured to electrically couple to the bit-line $BL_4$.

The channels 102 and 104 may be configured similar to the channel 100. Therefore, some detailed descriptions may refer to the corresponding paragraphs above and are not repeated hereinafter for conciseness.

In some embodiments, the bit-line $BL_4$ may include a longitudinal portion extending substantially parallel to a major surface of a substrate (such as the substrate 11 in FIG. 1G). In some embodiments, the bit-line $BL_4$ may include tungsten (W), a polysilicon (poly-Si), or combinations thereof.

In some embodiments, from the cross-section of FIG. 1B, the bit-line $BL_4$ may be configured to electrically couple to more than one landing pad (including the landing pad 10*p*).

For example, the bit-line $BL_4$ may be configured to electrically couple to two immediately adjacent channels 10 as shown in FIG. 1A. However, since the channels 10 in FIG. 1A are offset from both of their immediate neighbors, the line AA' does not cut through some of the channels 10 in FIG. 1A. Therefore, from the cross-section of FIG. 1B, the bit-line $BL_4$ may contact the channels 100, 102, and 104. The other two of the channels (i.e., the channels 101 and 103) may contact other portions of the bit-line $BL_4$ that cannot be seen the cross-section of FIG. 1B.

In some embodiments, the word-lines WL may each include a longitudinal portion extending substantially parallel to a major surface of a substrate (such as the substrate 11 in FIG. 1G).

In some embodiments, the word-lines WL may each include a single layer of metal, metal composite, or layers of conductive materials. In some embodiments, the word-lines WL may each include titanium (Ti), titanium nitride (TiN), titanium silicon nitride (TiSiN), tantalum (Ta), tantalum nitride (TaN), tantalum silicon nitride (TaSiN), tungsten (W), tungsten nitride (WN), tungsten silicide (WSi), tungsten silicon nitride (WSiN), a polysilicon (poly-Si), copper (Cu), aluminum (Al), cobalt (Co), cobalt silicide (CoSi), an alloy thereof, or a combination thereof.

In some embodiments, the gate lines V_ctrl may each include a longitudinal portion extending substantially parallel to a major surface of a substrate (such as the substrate 11 in FIG. 1G). In some embodiments, the gate lines V_ctrl may each include a single layer of metal, metal composite or layers of conductive materials. In some embodiments, the gate lines V_ctrl may each include a material as listed for the word-lines WL.

In some embodiments, the gate lines V_ctrl and the word-lines WL may at least partially overlap substantially perpendicular to a major surface of a substrate (such as the substrate 11 in FIG. 1G). For example, the channels 100, 102, and 104 may each pass or run through one of the gate lines V_ctrl and one of the word-lines WL.

In some embodiments, the gate line $V\_ctrl_0$ and the word-line $WL_0$ may be parts of a gate stack of an access transistor. In some embodiments, the gate line $V\_ctrl_0$ and the word-line $WL_0$ may have the same width. Similarly, the gate line $V\_ctrl_1$ and the word-line $WL_1$ may be parts of a gate stack of an access transistor.

In some embodiments, the gate lines V_ctrl and the word-lines WL may be disposed at different elevations with respect to a major surface of a substrate (such as the substrate 11 in FIG. 1G). For example, the gate lines V_ctrl may be closer to the bit-line $BL_4$ than the word-lines WL. For example, the word-lines WL may be farther from the bit-line $BL_4$ than the gate lines V_ctrl. For example, the word-lines WL may be closer to the substrate than the gate lines V_ctrl. For example, the gate lines V_ctrl may be farther from the substrate than the word-lines WL.

In some embodiments, the channels (such as the channels 100, 102, and 104) of the access transistors may be formed by, for example, defining a hole or an opening through layers by photolithography and etching and then filling the hole with appropriate materials.

In order to activate more access transistors with a single word-line, the memory cell density increases and critical dimensions decrease. Therefore, the aspect ratio of such channel continues to increase. For example, the aspect ratio of each of the channels (such as the channels 100, 102, and 104) of the access transistors may exceed 13, such as 14, 15, 16, 17, or more.

In FIG. 1B, the channel 100 passes or runs through a gate stack (including the gate lines $V\_ctrl_0$ and the word-line $WL_0$) to contact the substrate or a node of the storage capacitor. The channel 102 and the channel 104 also respectively pass through a gate stack to contact the substrate or a node of the storage capacitor.

However, in some other embodiments, not all of the channels pass or run through one of the gate lines V_ctrl and one of the word-lines WL to contact the substrate or a node of the storage capacitor. Some of the channels may stop or terminate at an elevation higher than the substrate or a node of the storage capacitor, as shown in FIG. 1C.

Figure 1C:
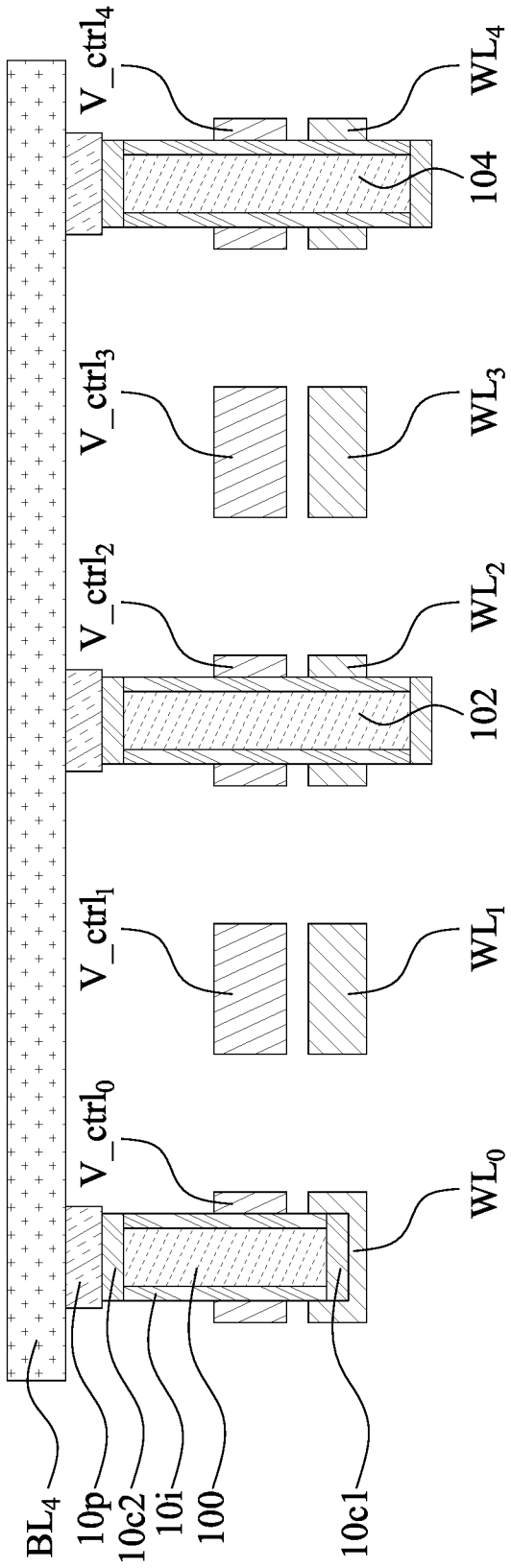
FIG. 1C is a schematic cross-sectional view of a semiconductor device in accordance with some embodiments of the present disclosure.

FIG. 1C is a schematic cross-sectional view of a semiconductor device 1*a'* in accordance with some embodiments of the present disclosure. In some embodiments, the semiconductor device 1*a'* of FIG. 1C may be a schematic cross-sectional view along line AA' in FIG. 1A.

The semiconductor device 1*a'* of FIG. 1C is similar to the semiconductor device 1*a* of FIG. 1B, except for the differences as follow.

The channel 100 may stop or terminate at the word-line $WL_0$. The electrical contact 10*c*1 may contact the word-line $WL_0$. The channel 100 may electrically connect with the word-line $WL_0$. The channel 100 may be shorted with the word-line $WL_0$. The bit-line $BL_4$ may be shorted with the word-line $WL_0$ through the channel 100.

The channel 100 may be shallower than the channels 102 and 104. The aspect ratio of the channels 102 and 104 may each exceed 13, such as 14, 15, 16, 17, or more. The aspect ratio of the channel 100 may be less than 13, such as 12, 11, 10, 9, or even less.

In some embodiments, the gate line $V\_ctrl_0$ may close, stop, cease or deplete the channel 100, without affecting or closing the other channels electrically coupled to the word-line $WL_0$ or the other channels electrically coupled to the bit-line $BL_4$, once the bit-line $BL_4$ is shorted with the word-line $WL_0$. For example, the gate line $V\_ctrl_0$ may be configured to close the current (i.e., flow of carriers in the channel).

For example, the gate line $V\_ctrl_0$ may be configured to close the channel 100. For example, the gate line $V\_ctrl_2$ may be configured to close the channel 102. For example, the gate line $V\_ctrl_4$ may be configured to close the channel 104.

In some embodiments, the word-line $WL_0$ may be applied with a ground voltage (or may be grounded) and the gate line $V\_ctrl_0$ may be applied with a negative voltage (or be reverse biased) to close or deplete the channel 100.

In a comparative embodiment without the gate lines V_ctrl, if an opening (such as the opening for forming the channel 100) is not etched deep enough, short-circuit may occur between the bit-line (such as the bit-line $BL_4$) and the word-line (such as the word-line $WL_0$) through the channel (such as the channel 100).

According to some embodiments of the present disclosure, by using gate lines V_ctrl disposed between the word-lines WL and the bit-lines BL, a control voltage may be supplied to one or more access transistors for closing channel(s) thereof once a short-circuit occurs between the bit-line and the word-line.

Therefore, the functions of the other channels connected by the bit-line may not be affected. More channels may be activated by a single bit-line. The effective read/write performance of the semiconductor device can be increased by allowing more data to be written to/read from the semiconductor device during a single operation.

Referring back to FIG. 1A, in a testing process of dummy cells, once the bit-line $BL_4$ and the word-line $WL_0$ are shorted together, the gate line $V\_ctrl_0$ may close the channel 100. The channels 101, 102, 103, and 104 can still run memory operations to evaluate whether the logic values are accurate or inaccurate.

Figure 1D:
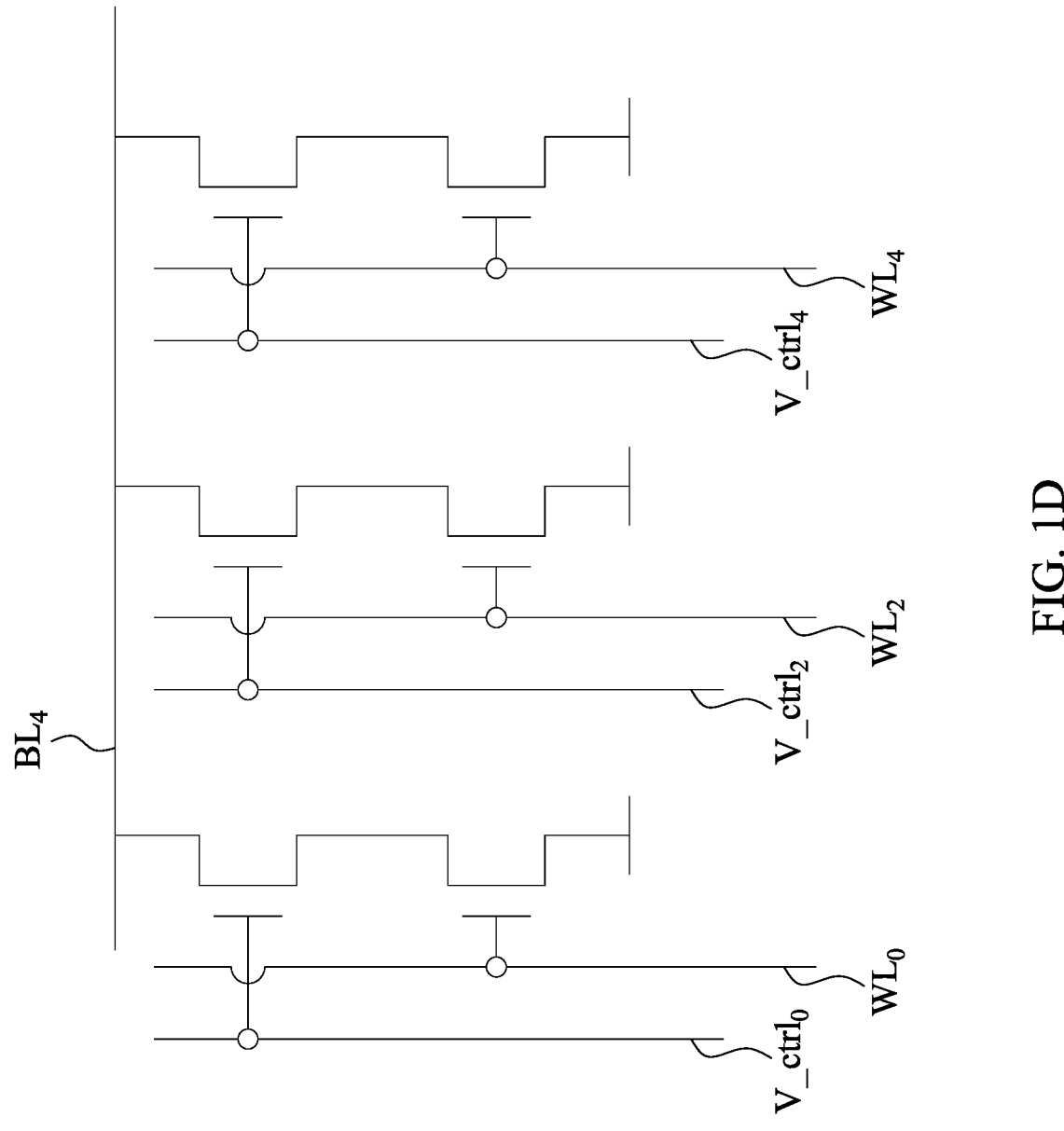
FIG. 1D is a schematic circuit diagram of a semiconductor device in accordance with some embodiments of the present disclosure.

FIG. 1D is a schematic circuit diagram of the semiconductor device in accordance with some embodiments of the present disclosure. In some embodiments, the semiconductor device 1a may have a schematic circuit diagram of FIG. 1D.

Two access transistors may be connected between the substrate (or a node of the storage capacitor) and the bit-line $BL_4$. The gate of the lower access transistor may be electrically coupled to the word-line $WL_0$ and the gate of the upper access transistor may be electrically coupled to the gate line $V\_ctrl_0$. If the bit-line $BL_4$ and the word-line $WL_0$ are shorted together, leakage current may be generated. The gate line $V\_ctrl_0$ may close the channel of the upper access transistor without affecting or closing the other channels electrically coupled to the bit-line $BL_4$.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Figure 1E:
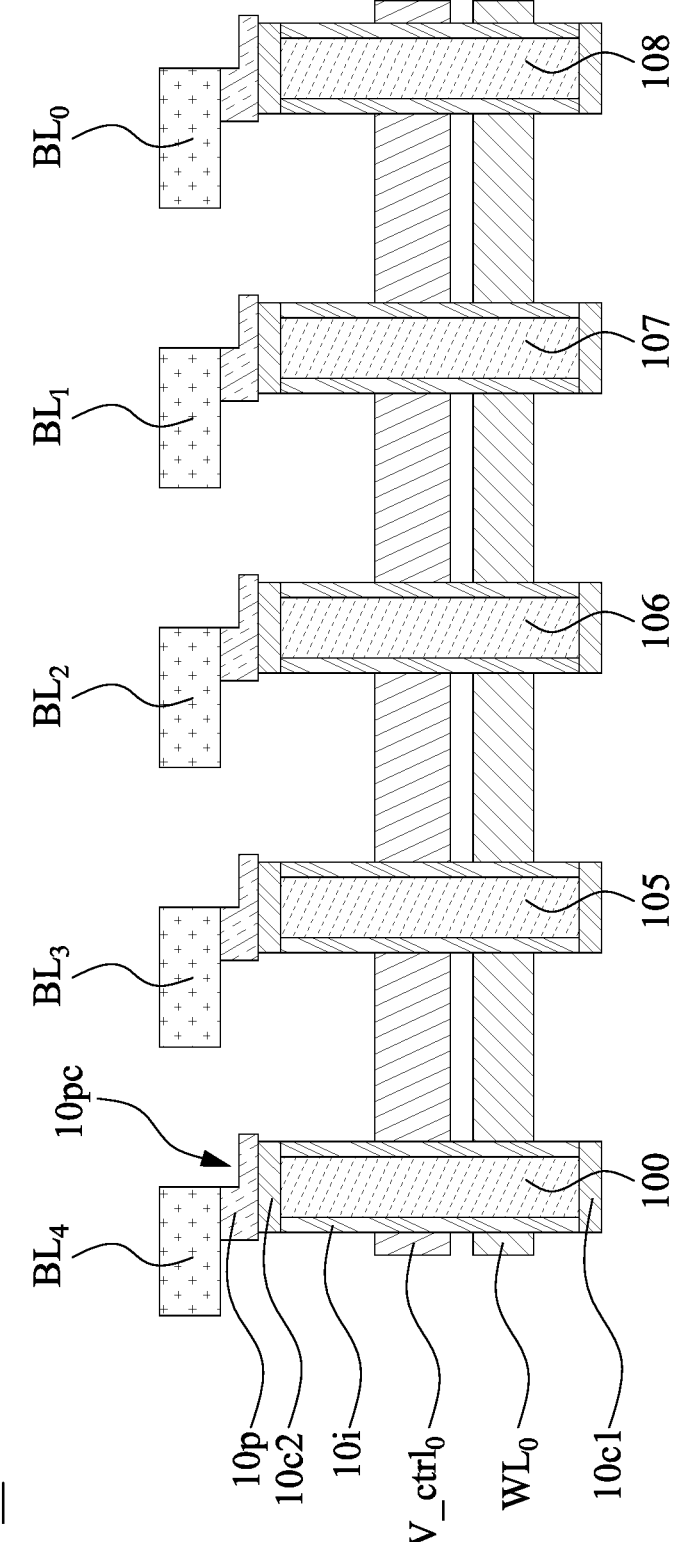
FIG. 1E is a schematic cross-sectional view of a semiconductor device in accordance with some embodiments of the present disclosure.

FIG. 1E is a schematic cross-sectional view of a semiconductor device 1b in accordance with some embodiments of the present disclosure. In some embodiments, the semiconductor device 1b of FIG. 1E may be a schematic cross-sectional view along line BB' in FIG. 1A.

The semiconductor device 1b of FIG. 1E is similar to the semiconductor device 1a of FIG. 1B, except for the differences as follow.

The landing pad 10p may define a concave corner 10pc. In some embodiments, the concave corner 10pc may be about 90°. In some embodiments, the concave corner 10pc may be greater than 90°. In some embodiments, a surface of the landing pad 10p and a surface of the bit-line $BL_4$ may be substantially coplanar.

A part of the landing pad 10p may protrude from the coplanar surface of the landing pad 10p and the bit-line $BL_4$. A part of the landing pad 10p may protrude along with the gate line $V\_ctrl_0$.

In some embodiments, the channel 100 may not entirely overlap with the bit-line $BL_4$. In some embodiments, the channel 100 may partially overlap with the bit-line $BL_4$ and partially non-overlapped with the bit-line $BL_4$.

Figure 1F:
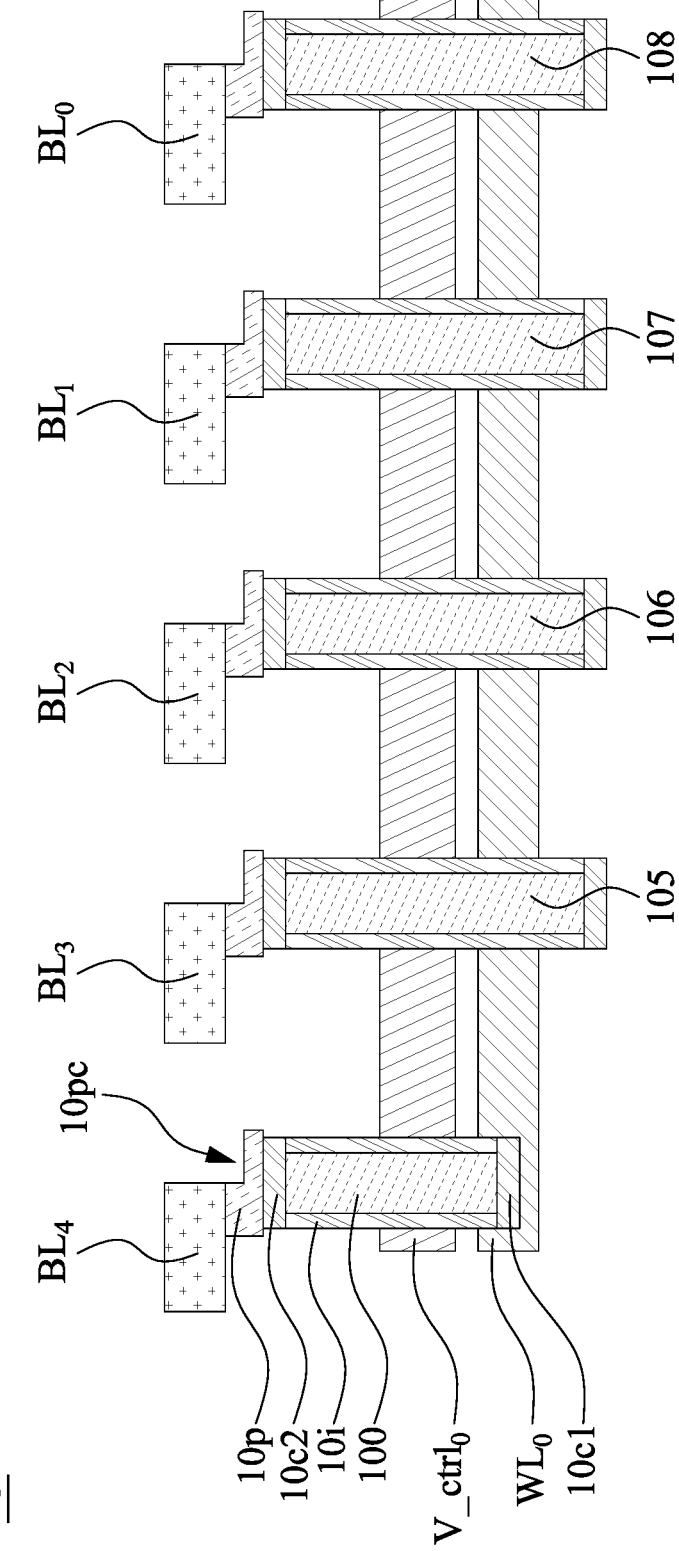
FIG. 1F is a schematic cross-sectional view of a semiconductor device in accordance with some embodiments of the present disclosure.
Figure 1G:
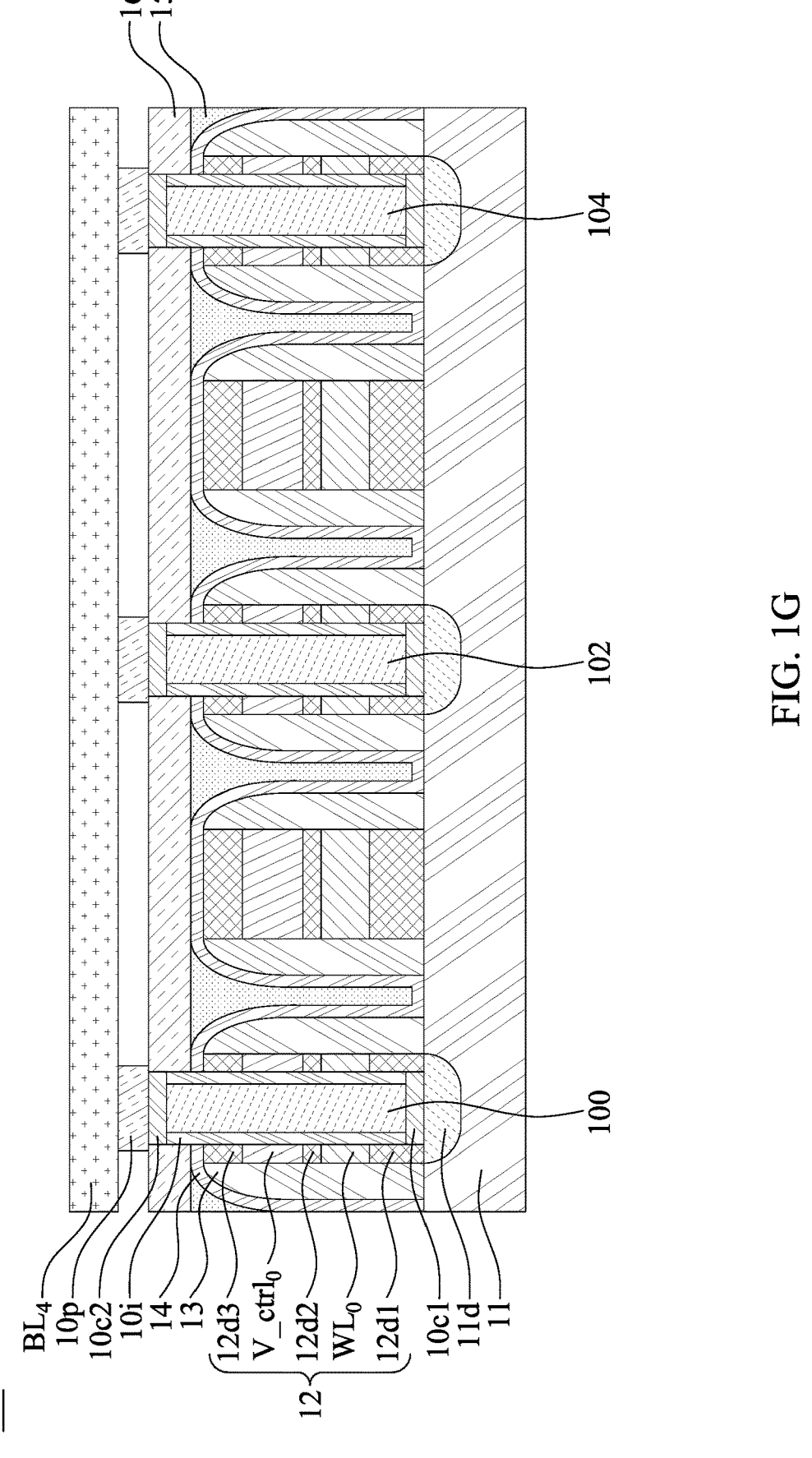
FIG. 1G is a schematic cross-sectional view of a semiconductor device in accordance with some embodiments of the present disclosure.

FIG. 1F is a schematic cross-sectional view of a semiconductor device 1b' in accordance with some embodiments of the present disclosure. In some embodiments, the semiconductor device 1b' of FIG. 1F may be a schematic cross-sectional view along line BB' in FIG. 1A.

The semiconductor device 1b' of FIG. 1F is similar to the semiconductor device 1b of FIG. 1E, except for the differences as follow.

The channel 100 may stop or terminate at the word-line $WL_0$. The electrical contact 10c1 may contact the word-line $WL_0$. The channel 100 may electrically connect with the word-line $WL_0$. The channel 100 may be shorted with the word-line $WL_0$. The bit-line $BL_4$ may be shorted with the word-line $WL_0$ through the channel 100.

FIG. 1G is a schematic cross-sectional view of a semiconductor device 1a" in accordance with some embodiments of the present disclosure. In some embodiments, the semiconductor device 1a" of FIG. 1G may be a schematic cross-sectional view along line AA' in FIG. 1A.

The semiconductor device 1a" of FIG. 1G is similar to the semiconductor device 1a of FIG. 1B, except for the differences as follow.

The semiconductor device 1a" may include the channels 100, 102, and 104, the bit-line $BL_4$, a substrate 11, a gate stack 12, a spacer structure 13, and interlayer dielectric layers 14, 15, 16.

The substrate 11 may include a semiconductor substrate. In some embodiments, the substrate 11 may include, for example, silicon (Si), monocrystalline silicon, polysilicon, amorphous silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-v or II-VI semiconductor materials. In some other embodiments, the substrate 11 may include a layered semiconductor such as silicon/silicon germanium, silicon-on-insulator, or silicon germanium-on-insulator.

In some embodiments, the substrate 11 may include a doped region 11d. The doped region 11d may contact the electrical contact 10c1. The doped region 11d may be electrically coupled to the channel 100.

In some embodiments, the doped region 11d may be doped with an N-type dopant such as phosphorus (P), arsenic (As), antimony (Sb), or a combination thereof. In some other embodiments, the doped region 11d may be doped with a P-type dopant such as boron (B) or indium (In). In some embodiments, the substrate 11 may be or include an unimplanted area. In some embodiments, the doped region 11d may have a higher doping concentration than the substrate 11.

In some embodiments, the doped region 11d may include a substantially constant doping concentration. In some embodiments, the doped region 11d may include a step, gradient, or other doping profile. For example, the doped region 11d may include a gradually changing doping concentration.

In some embodiments, the doped region 11d may be referred to as source/drain regions. In some embodiments, the doped region 11d may include a bit-line contact region and may electrically connect with the bit-line $BL_4$. In some embodiments, the doped region 11d may include a storage node junction region and may electrically connect with a memory element, such as a storage capacitor. In some embodiments, a metal silicide may be disposed on the doped region 11d to reduce the contact resistance.

The gate stack 12 may include insulating layers 12d1, 12d2, 12d3, the gate line $V\_ctrl_0$, and the word-line $WL_0$. The channel 100 may penetrate the gate stack 12.

The insulating layer 12d1 may be disposed on the doped region 11d. The insulating layer 12d1 may be disposed between the doped region 11d and the word-line $WL_0$. The word-line $WL_0$ may be insulated or separated from the channel 100 by the insulating layer 12$d$1 and the dielectric layer 10$i$.

The insulating layer 12$d$1 may include an oxide layer. In some embodiments, the insulating layer 12$d$1 may include, for example, silicon oxide ($SiO_2$), silicon nitride ($Si_3N_4$), or a combination thereof.

The insulating layer 12$d$2 may be disposed on the word-line $WL_0$. The insulating layer 12$d$2 may disposed between the word-line $WL_0$ and the gate line V_ctrl$_0$. The word-line $WL_0$ may be insulated or separated from the gate line V_ctrl$_0$ by the insulating layer 12$d$2.

The material of the insulating layer 12$d$2 may be the same as or different from that of the insulating layer 12$d$1.

The insulating layer 12$d$3 may be disposed on the gate line V_ctrl$_0$. The insulating layer 12$d$3 may serve to protect the gate line V_ctrl$_0$.

The insulating layer 12$d$3 may include a capping layer. In some embodiments, the insulating layer 12$d$3 may include silicon oxide ($SiO_2$), silicon nitride ($Si_3N_4$), or a combination thereof. In some embodiments, the insulating layer 12$d$3 may include a silicon nitride liner and a spin-on-dielectric (SOD) material.

The other gate stacks may be similar to the gate stack 12. Therefore, some detailed descriptions may refer to the corresponding paragraphs here and are not repeated hereinafter for conciseness.

The spacer structure 13 may be disposed on sides or lateral surfaces of the gate stack 12. The spacer structure 13 may extend along the gate stack 12. The spacer structures 13 may include silicon nitride ($Si_3N_4$), silicon oxynitride ($N_2OSi_2$), silicon nitride oxide ($N_2OSi_2$), etc. However, in some other embodiments, the spacer structure 13 may be omitted.

The interlayer dielectric layer 14 may be conformally disposed on the spacer structure 13 and the gate stack 12. The interlayer dielectric layer 15 may fill gaps between the gate stacks. The interlayer dielectric layer 16 may be disposed on the interlayer dielectric layer 15 to define the locations for forming openings of the channels. The interlayer dielectric layers 14, 15, and 16 may each include silicon nitride ($Si_3N_4$), silicon oxynitride ($N_2OSi_2$), silicon nitride oxide ($N_2OSi_2$), etc.

Figure 1H:
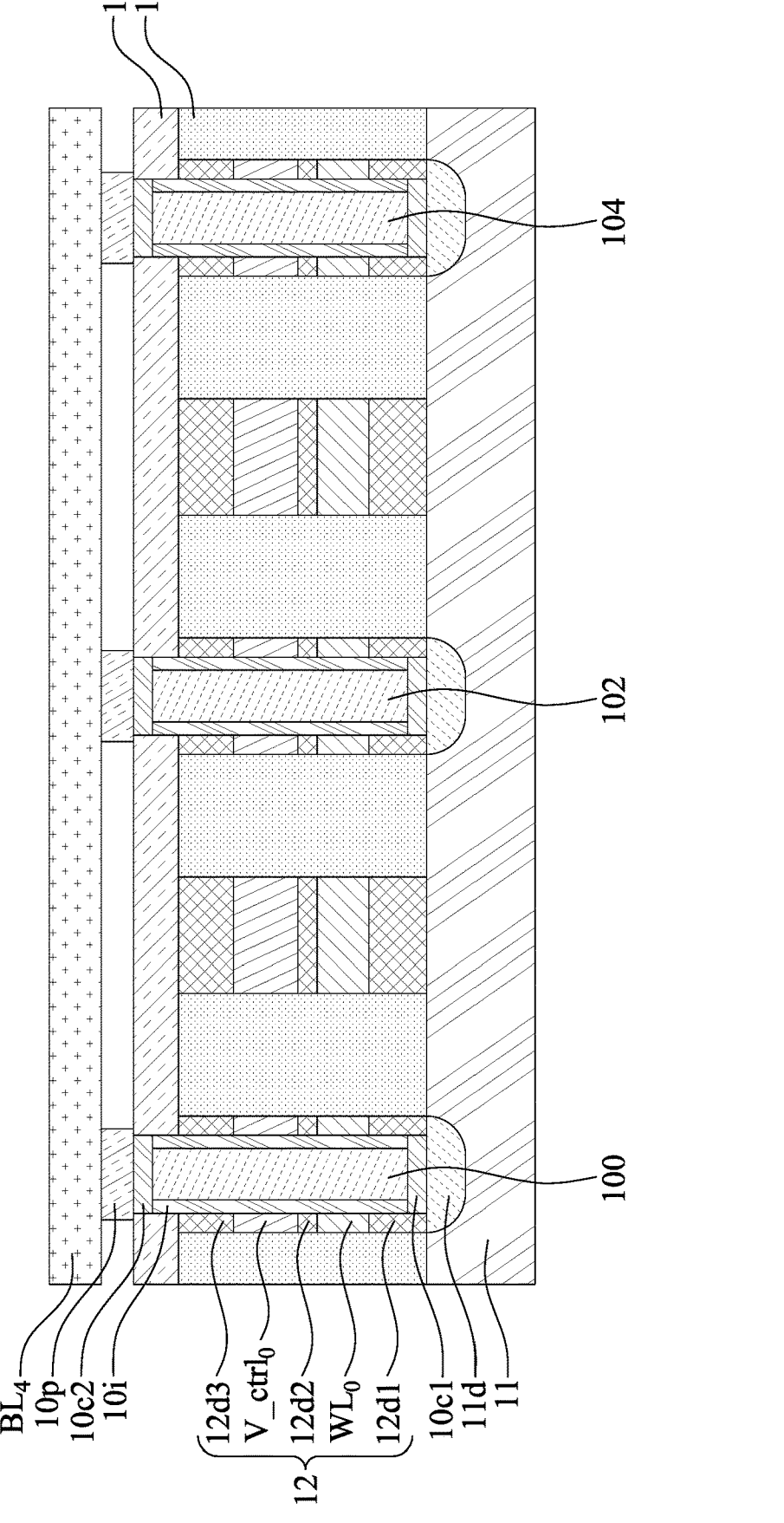
FIG. 1H is a schematic cross-sectional view of a semiconductor device in accordance with some embodiments of the present disclosure.

FIG. 1H is a schematic cross-sectional view of a semiconductor device in accordance with some embodiments of the present disclosure. In some embodiments, the semiconductor device of FIG. 1H may be a schematic cross-sectional view along line AA' in FIG. 1A.

The semiconductor device of FIG. 1H is similar to the semiconductor device 1$a''$ of FIG. 1G, except that the spacer structure 13 and the interlayer dielectric layer 14 may be omitted. The gate stack 12 may be surrounded by the interlayer dielectric layer 15 or other insulating materials. In some embodiments, since the spacer structure 13 and the interlayer dielectric layer 14 are omitted, the critical dimension of the channels of the semiconductor device of FIG. 1H may be further decreased.

Figure 2A:
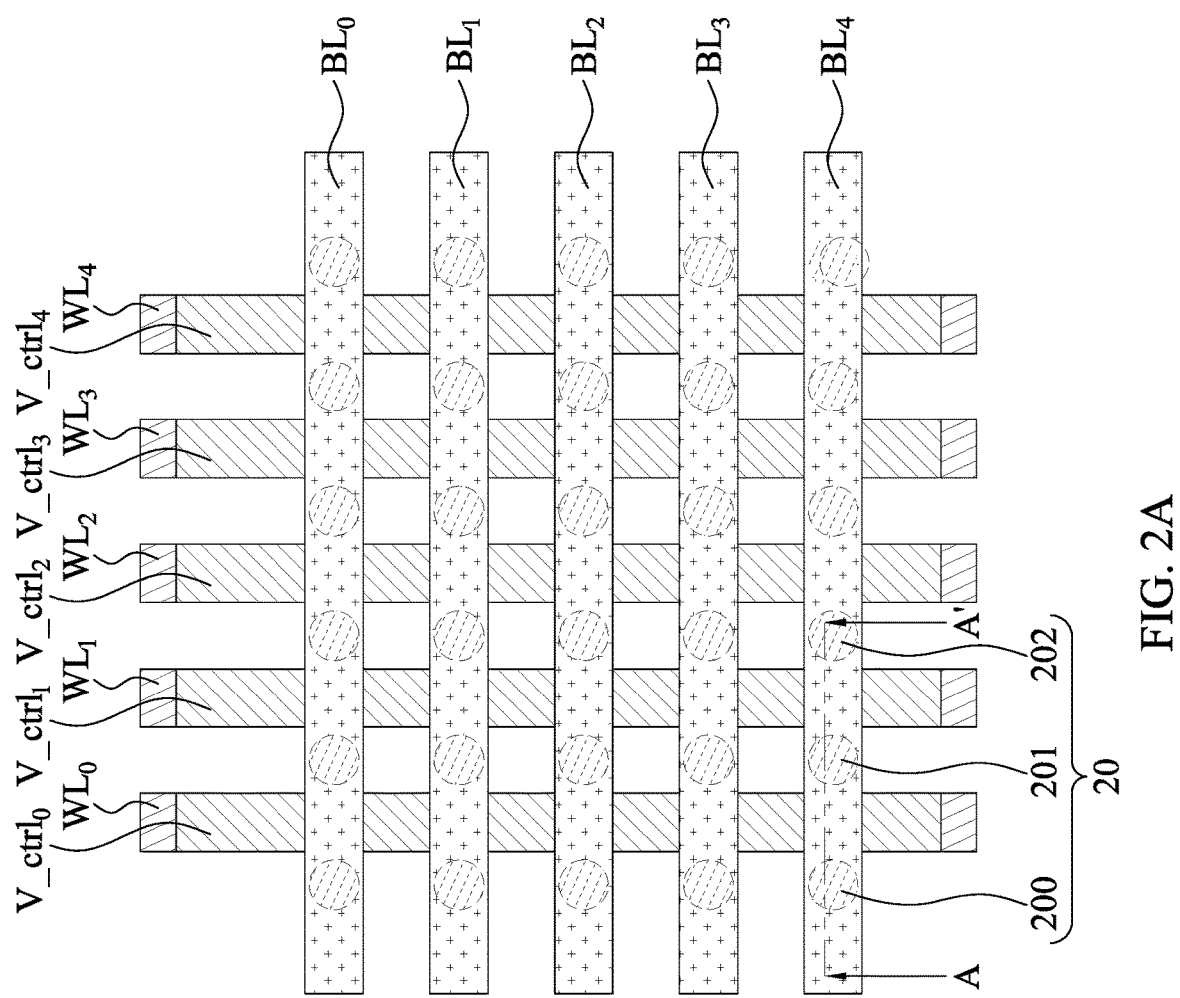
FIG. 2A is a schematic top view of a semiconductor device in accordance with some embodiments of the present disclosure.
Figure 2A:
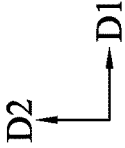

FIG. 2A is a schematic top view of a semiconductor device 2 in accordance with some embodiments of the present disclosure. The semiconductor device 2 of FIG. 2A is similar to the semiconductor device 1 of FIG. 1A, except for the differences as follow.

The semiconductor device 2 may include channels, such as channels 200, 201, 202 (collectively referred to as channels 20).

The channels 20 may not overlap with the word-lines WL. The channels 20 may be spaced apart from the word-lines WL. For example, the channel 201 may be disposed between the word-line $WL_0$ and the word-lines $WL_1$. For example, the channel 202 may be disposed between the word-line $WL_1$ and the word-lines $WL_2$.

Similarly, the channels 20 may not overlap with the gate lines V_ctrl. The channels 20 may be spaced apart from the gate lines V_ctrl. For example, the channel 201 may be disposed between the gate line V_ctrl$_0$ and the gate lines V_ctrl$_1$. For example, the channel 202 may be disposed between the gate line V_ctrl$_1$ and the gate line V_ctrl$_2$.

Figure 2B:
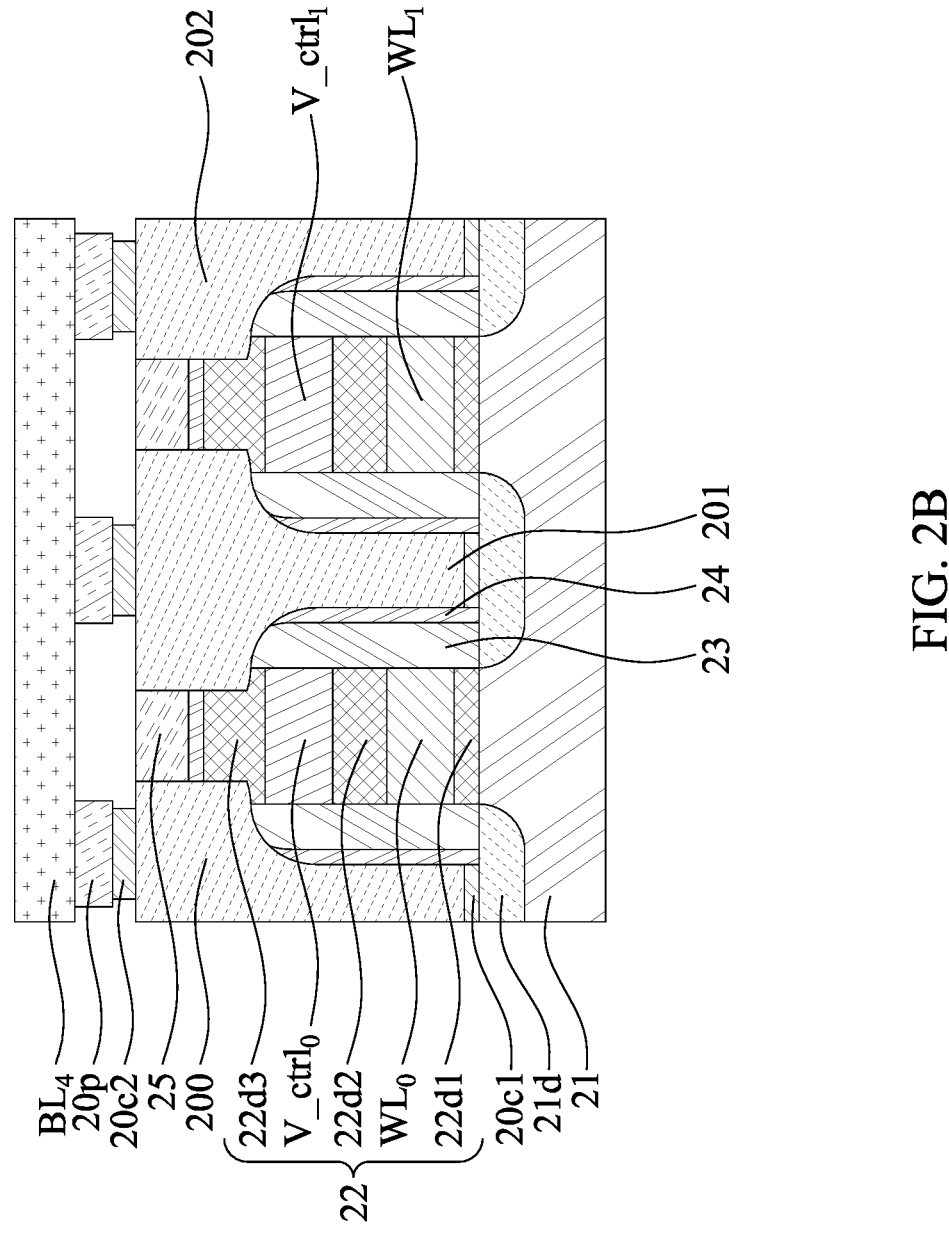
FIG. 2B is a schematic cross-sectional view of a semiconductor device in accordance with some embodiments of the present disclosure.

FIG. 2B is a schematic cross-sectional view of a semiconductor device 2$a$ in accordance with some embodiments of the present disclosure. In some embodiments, the semiconductor device 2$a$ of FIG. 2B may be a schematic cross-sectional view along line AA' in FIG. 2A.

The semiconductor device 2$a$ of FIG. 2B is similar to the semiconductor device 1$a''$ of FIG. 1G, except for the differences as follow.

The semiconductor device 2$a$ may include the channels 200, 201, and 202, the bit-line $BL_4$, a substrate 21, a gate stack 22, a spacer structure 23, and interlayer dielectric layers 24, 25.

The substrate 21 may be similar to the substrate 11. In some embodiments, the substrate 21 may include a doped region 21$d$. The doped region 21$d$ may be disposed between two gate stacks.

The gate stack 22 may include insulating layers 22$d$1, 22$d$2, 22$d$3, the gate line V_ctrl$_0$, and the word-line $WL_0$. The gate stack 22 may be similar to the gate stack 12.

The spacer structure 23 may be similar to the spacer structure 13. The interlayer dielectric layer 24 may be similar to the interlayer dielectric layer 14. The interlayer dielectric layer 25 may be similar to the interlayer dielectric layer 15.

The channel 200 may be electrically coupled to the doped region 21$d$ through the electrical contact 20$c$1. The channel 200 may be electrically coupled to the bit-line $BL_4$ through the electrical contact 20$c$2 and the landing pad 20$p$.

The channel 200 may not penetrate the gate stack 22. The channel 201 may not penetrate the gate stack 22. The channel 200 may be spaced apart from the gate stack 22. Similarly, the channel 201 may be spaced apart from the gate stack 22.

The word-line $WL_0$ may be insulated or separated from the channel 200 by the spacer structure 23 and the interlayer dielectric layer 24. Similarly, the word-line $WL_0$ may be insulated or separated from the channel 201 by the spacer structure 23 and the interlayer dielectric layer 24.

The channels 200, 201, and 202 may each tapper toward the substrate 21.

For example, the upper portion of the channel 201 may be wider than the lower portion of the channel 201. The lower portion of the channel 201 may be surrounded or covered by the interlayer dielectric layer 24. The upper portion of the channel 201 may extend into the interlayer dielectric layer 25, the interlayer dielectric layer 24, the spacer structure 23, and the insulating layer 22$d$3.

The upper portion of the channel 201 may contact the insulating layer 22$d$3. The upper portion of the channel 201 may be surrounded by the insulating layer 22$d$3.

In some embodiments, in order to form a channel deeper enough to contact the substrate or a node of the storage capacitor, an aspect ratio of such channel may exceed 13, such as 14, 15, 16, 17, or more.

The spacer structure 23 and the interlayer dielectric layer 24 may be configured to insulate or separate the channels from the word-lines.

Figure 2C:
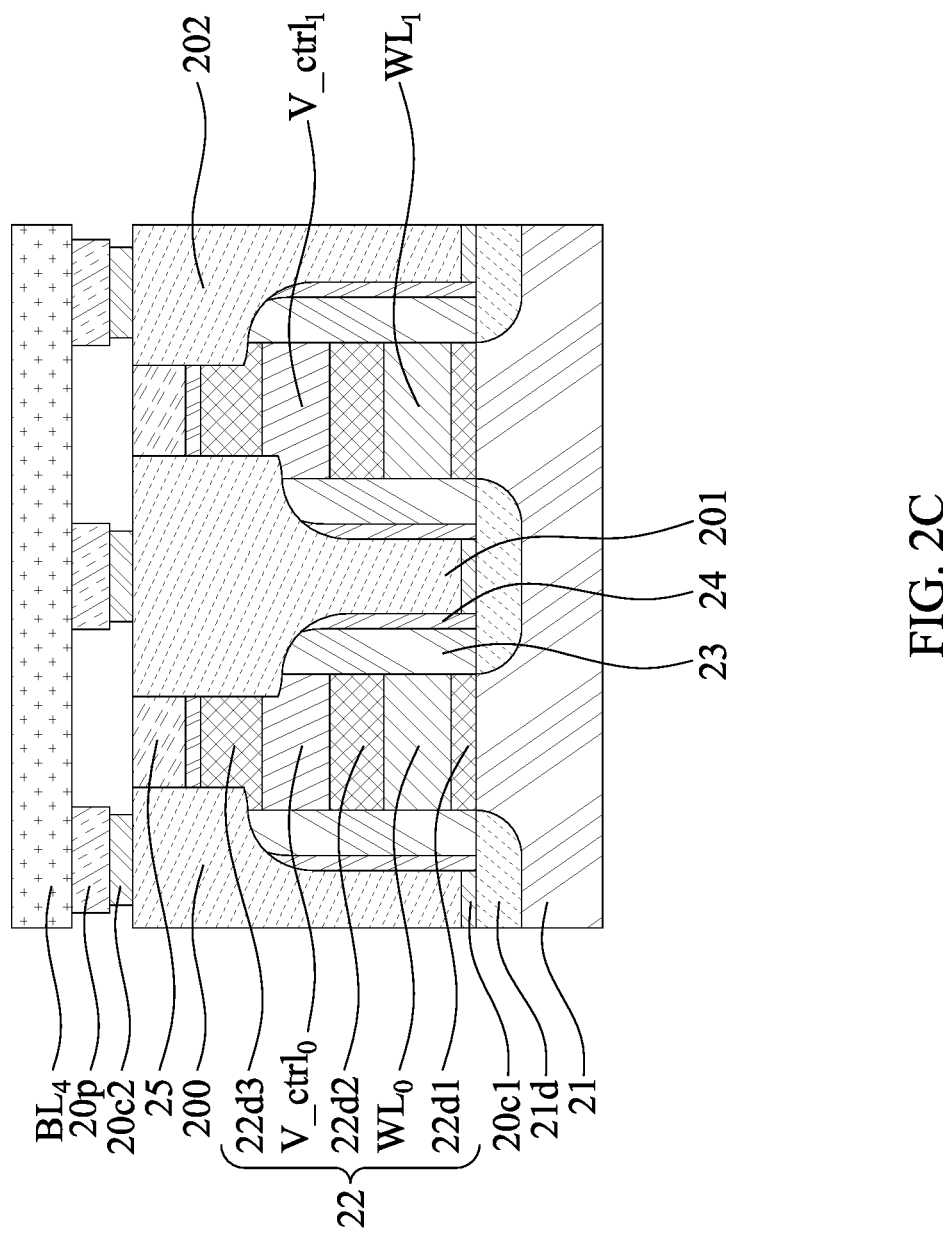
FIG. 2C is a schematic cross-sectional view of a semiconductor device in accordance with some embodiments of the present disclosure.

However, in some other embodiments, deviations of the critical dimension may occur, and cause short-circuit problems between the bit-lines and the word-lines, as shown in FIG. 2C.

FIG. 2C is a schematic cross-sectional view of a semiconductor device $2a'$ in accordance with some embodiments of the present disclosure. In some embodiments, the semiconductor device $2a'$ of FIG. 2C may be a schematic cross-sectional view along line AA' in FIG. 2A.

The semiconductor device $2a'$ of FIG. 2C is similar to the semiconductor device $2a$ of FIG. 2B, except for the differences as follow.

The channel 201 may extend into the interlayer dielectric layer 24, the spacer structure 23, and the gate line $V\_ctrl_0$. The channel 201 may contact the gate line $V\_ctrl_0$. The channel 201 may be surrounded by the gate line $V\_ctrl_0$. The channel 201 may be shorted with the gate line $V\_ctrl_0$.

In some embodiments, the gate line $V\_ctrl_0$ may close the channel 201 without affecting or closing the other channels electrically coupled to the word-line $WL_0$.

In some embodiments, the channel 201 may contact the gate line $V\_ctrl_1$. The channel 201 may be surrounded by the gate line $V\_ctrl_1$. The channel 201 may be shorted with the gate line $V\_ctrl_1$.

In some embodiments, the gate line $V\_ctrl_1$ may close the channel 201 without affecting or closing the other channels electrically coupled to the word-line $WL_1$.

FIGS. 3A, 3B, 3C, and 3D illustrate stages of a method of manufacturing a semiconductor device in accordance with some embodiments of the present disclosure. At least some of these figures have been simplified for a better understanding of the aspects of the present disclosure. In some embodiments, the semiconductor device in FIG. 1H may be manufactured by the operations described here with respect to FIGS. 3A, 3B, 3C, and 3D.

Figure 3A:
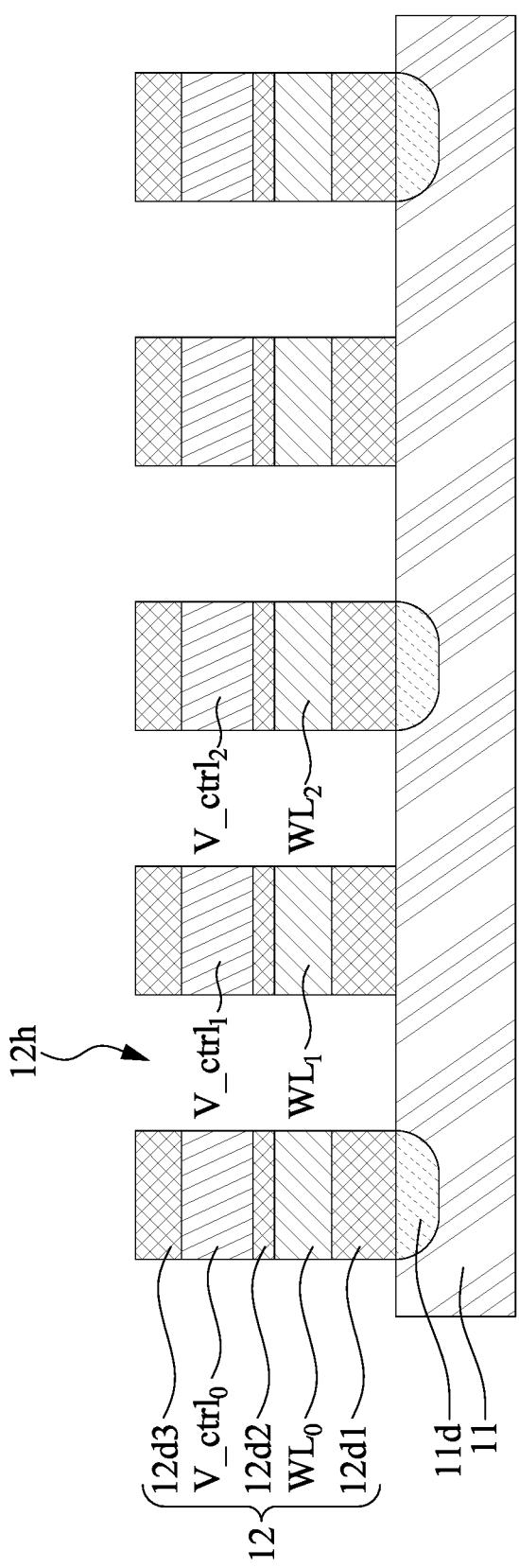
FIG. 3A illustrates one or more stages of a method of manufacturing a semiconductor device in accordance with some embodiments of the present disclosure.

Referring to FIG. 3A, the substrate 11 may be provided. A doping process of an impurity may be performed by implantation or other doping technique. Accordingly, the doped region $11d$ may be formed in the substrate 11.

A gate stack 12 may be formed on the substrate 11. In some embodiments, the insulating layer $12d1$ may be formed by a thermal oxidation operation, a physical vapor deposition (PVD), a chemical vapor deposition (CVD) process, or an ALD process. The word-line $WL_0$ may be disposed on the insulating layer $12d1$ by a CVD process or an ALD process. The insulating layer $12d2$ may be disposed on the word-line $WL_0$. The gate line $V\_ctrl_0$ may be disposed on the insulating layer $12d2$ by a CVD process or an ALD process. The insulating layer $12d3$ may be disposed on the gate line $V\_ctrl_0$.

Openings $12h$ may be formed by photolithography and etching. First, a mask may be formed over the gate stack and patterned to form openings exposing the gate stack. The mask may include any suitable material, such as one or more layer of photoresist and/or hard mask material. Then, the gate stack may be etched (e.g., using reactive ion etching (RIE)) to form the openings $12h$ in the gate stack. Several gate stacks may be separated by the openings $12h$.

Figure 3B:
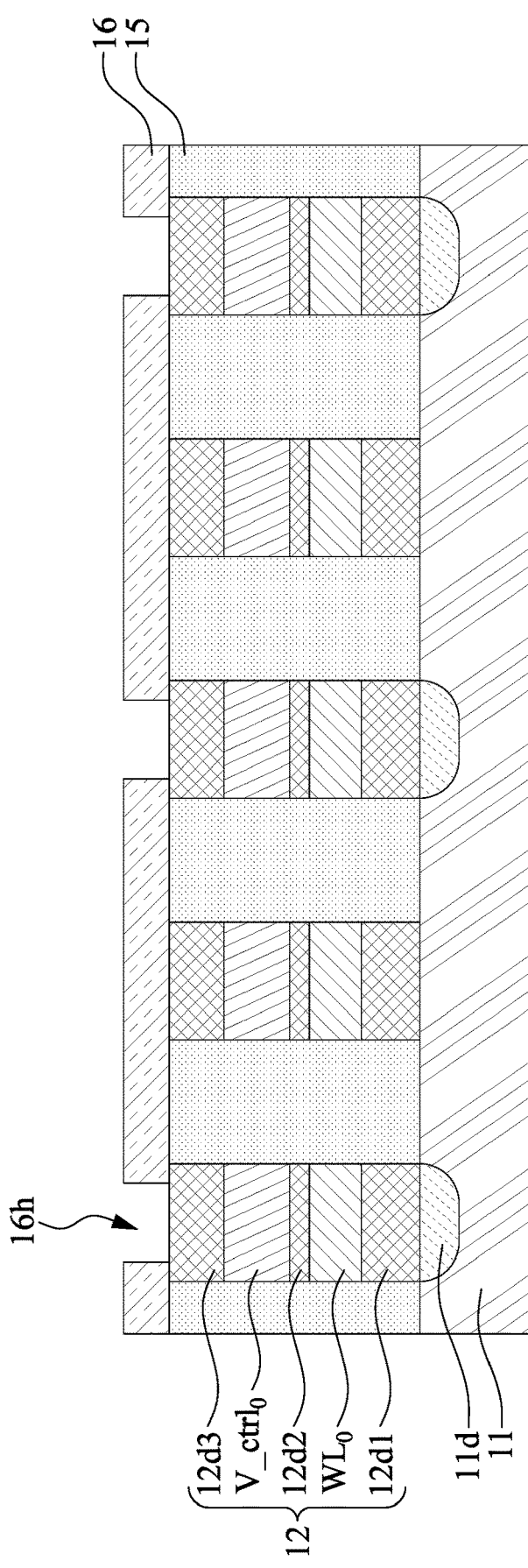
FIG. 3B illustrates one or more stages of a method of manufacturing a semiconductor device in accordance with some embodiments of the present disclosure.

Referring to FIG. 3B, the interlayer dielectric layer 15 may be formed in the openings $12h$ by, for example, ALD, CVD, PVD, RPCVD, PECVD, coating, etc. Also, a planarization process such as chemical-mechanical polishing (CMP) may be additionally performed.

The interlayer dielectric layer 16 may be formed on the interlayer dielectric layer 15 by, for example, ALD, CVD, PVD, RPCVD, PECVD, coating, etc. The interlayer dielectric layer 16 may be patterned to form openings $16h$ to define the locations of the channels formed in the subsequent operations.

Figure 3C:
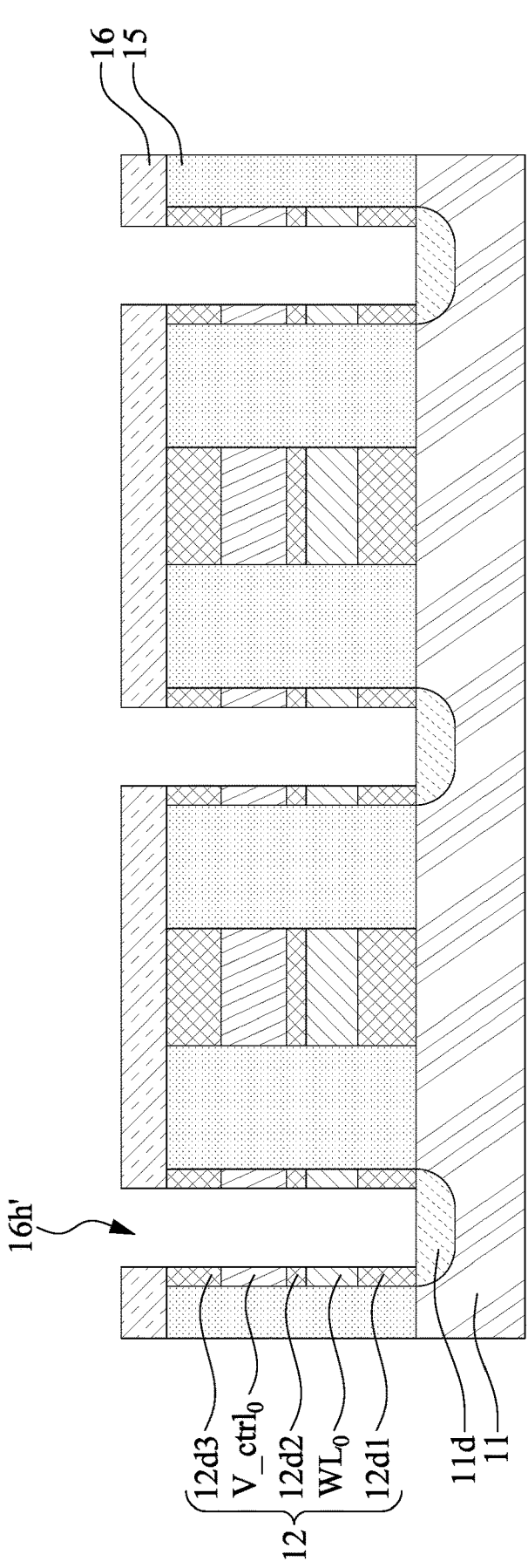
FIG. 3C illustrates one or more stages of a method of manufacturing a semiconductor device in accordance with some embodiments of the present disclosure.

Referring to FIG. 3C, the gate stack 12 may be etched through the interlayer dielectric layer 16 to form openings $16h'$ corresponding to the locations of the openings $16h$.

Figure 3D:
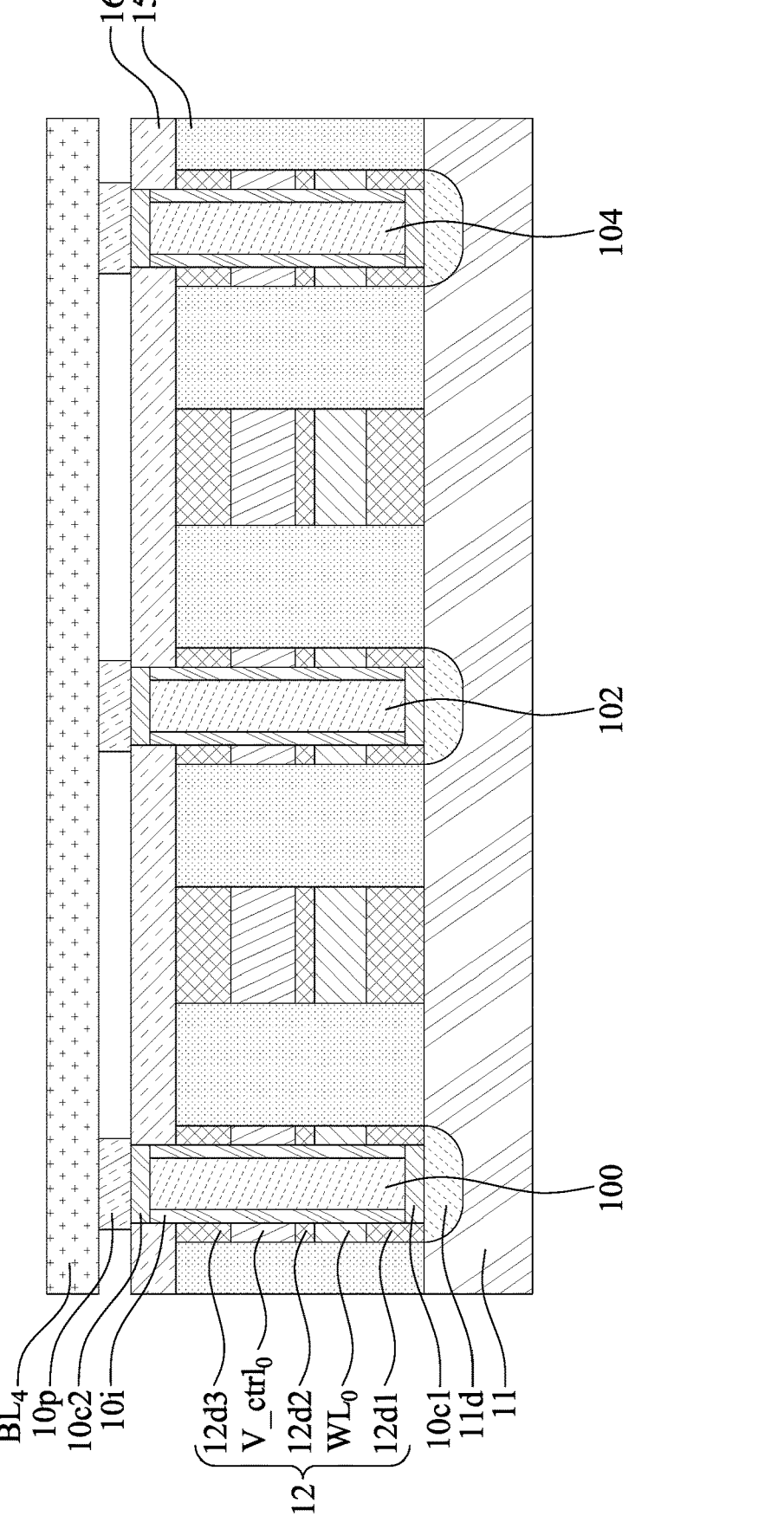
FIG. 3D illustrates one or more stages of a method of manufacturing a semiconductor device in accordance with some embodiments of the present disclosure.

Referring to FIG. 3D, the electrical contact $10c1$ may be disposed in the openings $16h$. The channel 100 may be formed in the openings $16h$ by using vapor phase epitaxial growth to grow mono-crystalline silicon from the bottom of the vertically-oriented channel upwards to the top of the vertically-oriented channel. In some embodiments, the channel 100 may be formed by recrystallizing an initially deposited amorphous semiconductor material.

In some embodiments, subsequent to the formation of the channel 100, the bit-line $BL_4$ may be formed over the channel 100. In some embodiments, a plurality of wiring layers and interlayer insulating films may be formed over the channel 100.

Figure 4:
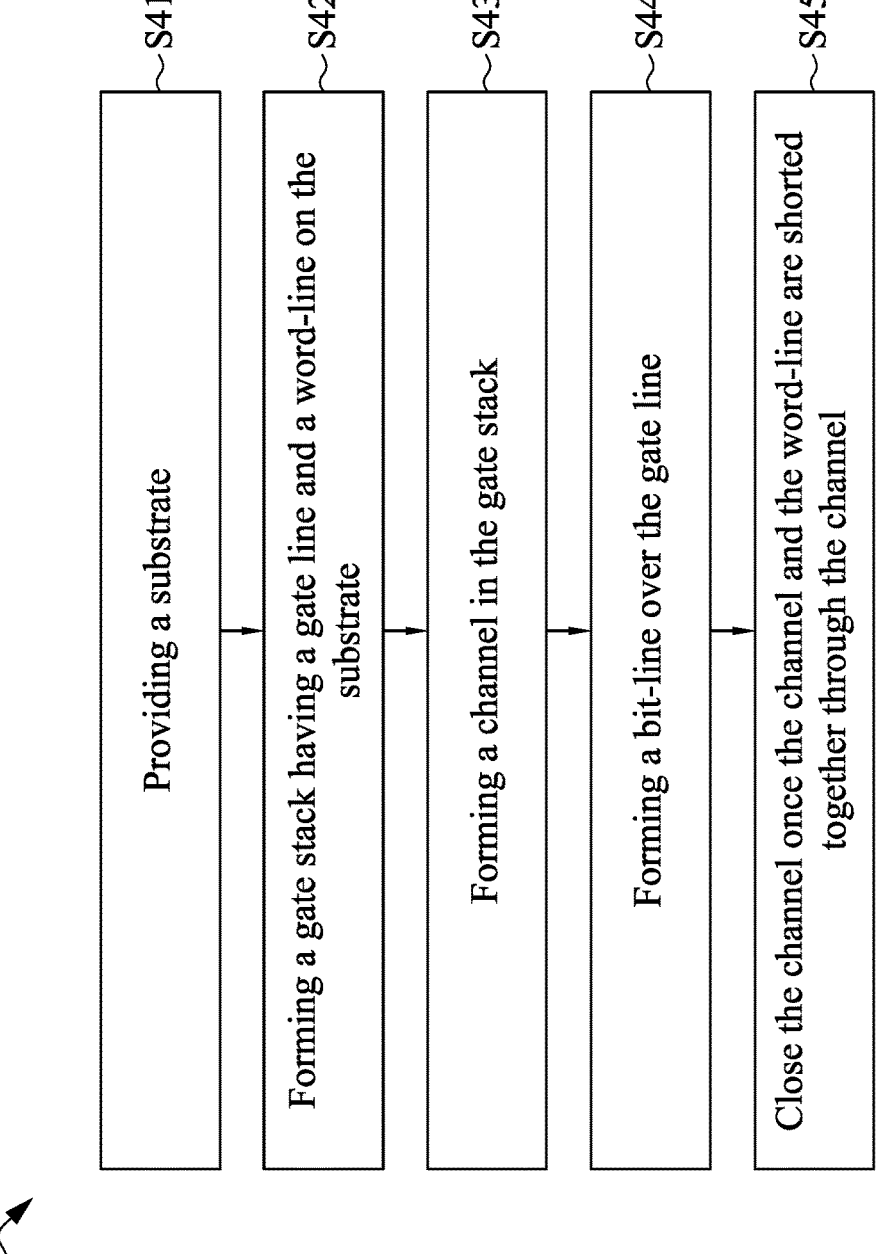
FIG. 4 is a flowchart of a method of manufacturing a semiconductor device in accordance with some embodiments of the present disclosure.

FIG. 4 is a flowchart of a method 40 of manufacturing a semiconductor device in accordance with some embodiments of the present disclosure.

In some embodiments, the method 40 may include a step S41, providing a substrate. For example, as shown in FIG. 3A, the substrate 11 may be provided.

In some embodiments, the method 40 may include a step S42, forming a gate stack having a gate line and a word-line on the substrate. For example, as shown in FIG. 3A, the gate stack 12 may be formed on the substrate.

In some embodiments, the method 40 may include a step S43, forming a channel in the gate stack. For example, as shown in FIG. 3D, the channel 100 may be formed in the gate stack 12.

In some embodiments, the method 40 may include a step S44, forming a bit-line over the gate line. For example, as shown in FIG. 3D, the bit-line $BL_4$ may be formed over the gate line $V\_ctrl_0$.

In some embodiments, the method 40 may include a step S45, closing the channel once the bit-line and the word-line are shorted together through the channel. For example, as shown in FIG. 1C, the channel 100 may stop or terminate at the word-line $WL_0$. The electrical contact $10c1$ may contact the gate line word-line $WL_0$. The channel 100 may electrically connect with the word-line $WL_0$. The bit-line $BL_4$ may be shorted with the word-line $WL_0$. The gate line $V\_ctrl_0$ may be configured to close the channel 100 without affecting or closing the other channels electrically coupled to the word-line $WL_0$.

FIGS. 5A, 5B, 5C, 5D, 5E, 5F, and 5G illustrate stages of a method of manufacturing a semiconductor device in accordance with some embodiments of the present disclosure. At least some of these figures have been simplified for a better understanding of the aspects of the present disclosure. In some embodiments, the semiconductor device $2a$ in FIG. 2B may be manufactured by the operations described below with respect to FIGS. 5A, 5B, 5C, 5D, 5E, 5F, and 5G.

Figure 5A:
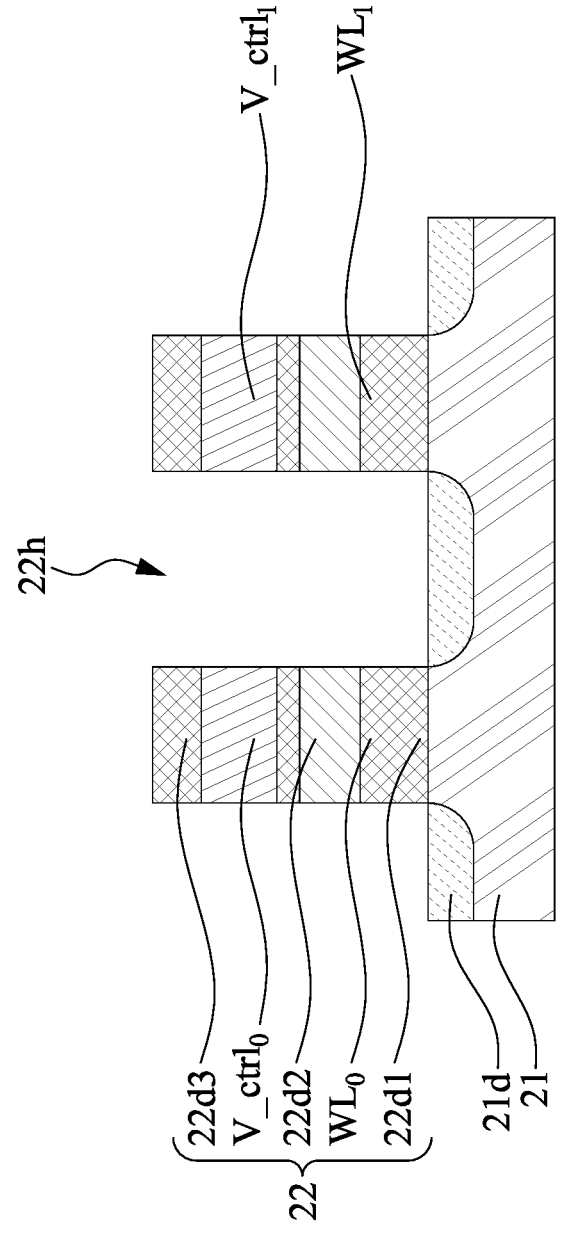
FIG. 5A illustrates one or more stages of a method of manufacturing a semiconductor device in accordance with some embodiments of the present disclosure.

Referring to FIG. 5A, the substrate 21 may be provided. A doping process of an impurity may be performed by implantation or other doping technique. Accordingly, the doped region $21d$ may be formed in the substrate 21.

A gate stack 22 may be formed on the substrate 21. Openings $22h$ may be formed by photolithography and etching. Several gate stacks may be separated by the openings $22h$.

Figure 5B:
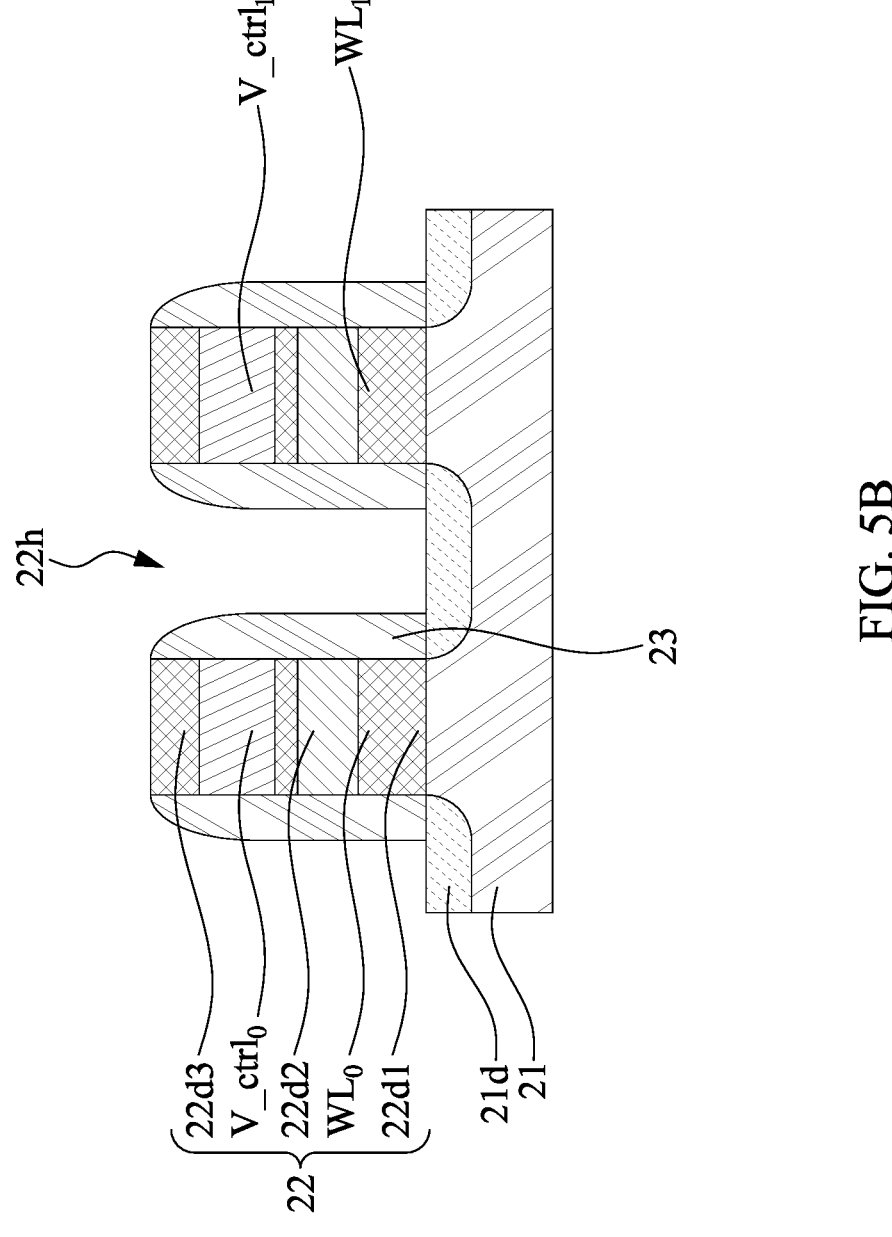
FIG. 5B illustrates one or more stages of a method of manufacturing a semiconductor device in accordance with some embodiments of the present disclosure.

Referring to FIG. 5B, a sacrificial spacer layer may be formed over the substrate 21 using a suitable process such as CVD. An anisotropic etching process may be performed to remove a portion of the sacrificial spacer layer to form the spacer structure 23 on the sidewalls of the gate stacks.

Figure 5C:
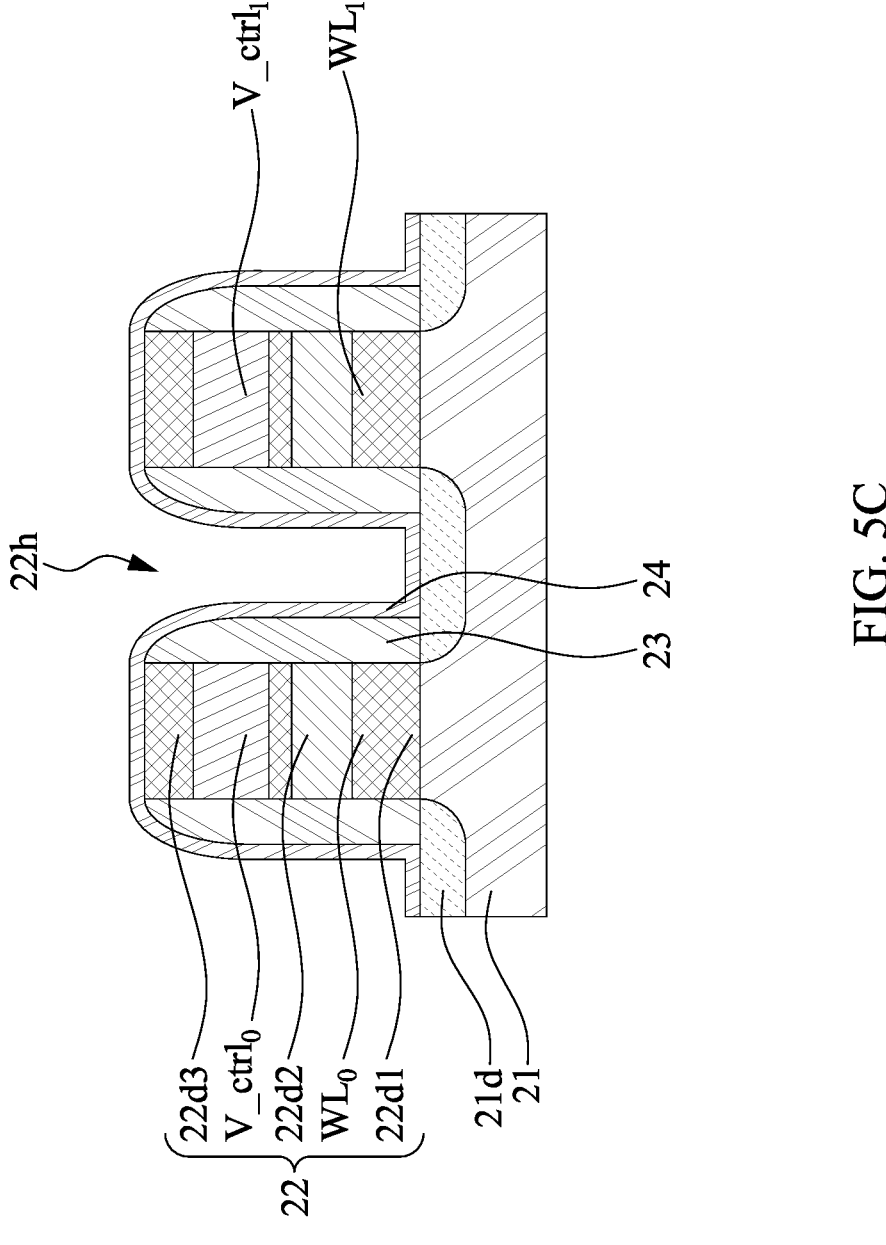
FIG. 5C illustrates one or more stages of a method of manufacturing a semiconductor device in accordance with some embodiments of the present disclosure.

Referring to FIG. 5C, the interlayer dielectric layer 24 may be formed on the top surface of the structure from FIG. 5B by, for example, ALD, CVD, PVD, RPCVD, PECVD, coating, etc.

Figure 5D:
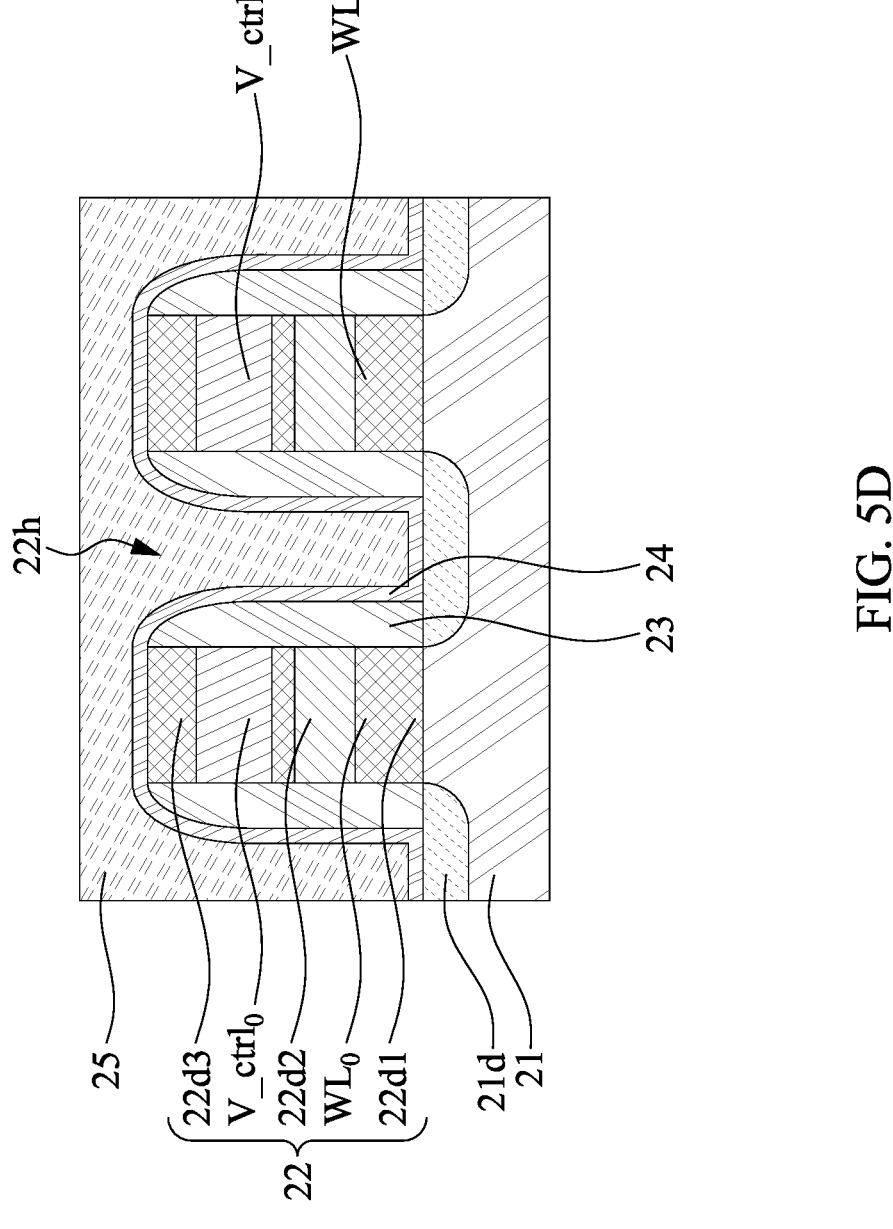
FIG. 5D illustrates one or more stages of a method of manufacturing a semiconductor device in accordance with some embodiments of the present disclosure.

Referring to FIG. 5D, the interlayer dielectric layer 25 may be formed in the openings 22*h* by, for example, ALD, CVD, PVD, RPCVD, PECVD, coating, etc.

Figure 5E:
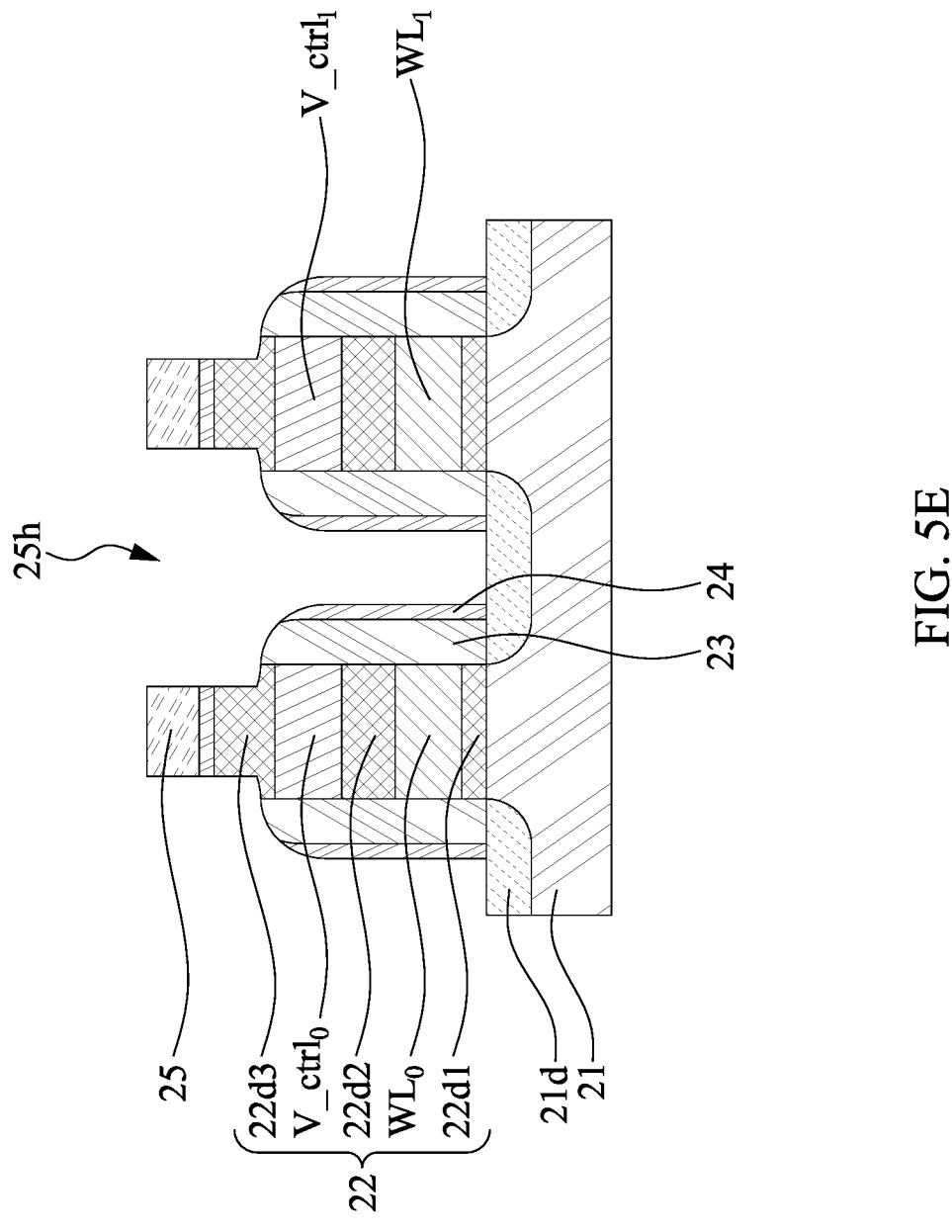
FIG. 5E illustrates one or more stages of a method of manufacturing a semiconductor device in accordance with some embodiments of the present disclosure.

Referring to FIG. 5E, the interlayer dielectric layer 25 may be etched to form openings 25*h*.

Figure 5F:
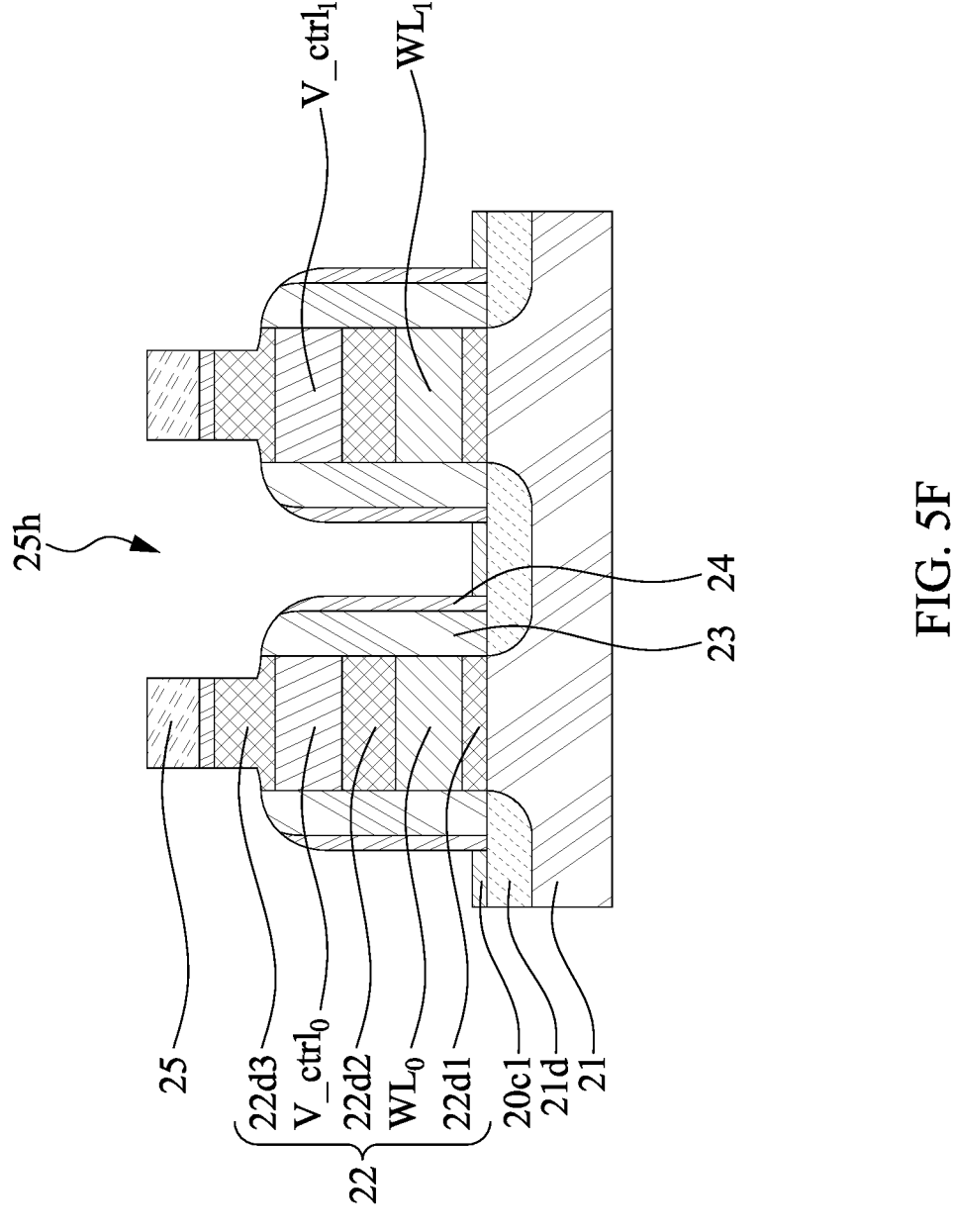
FIG. 5F illustrates one or more stages of a method of manufacturing a semiconductor device in accordance with some embodiments of the present disclosure.

Referring to FIG. 5F, the electrical contact 20*c*1 may be disposed in the openings 25*h*.

Figure 5G:
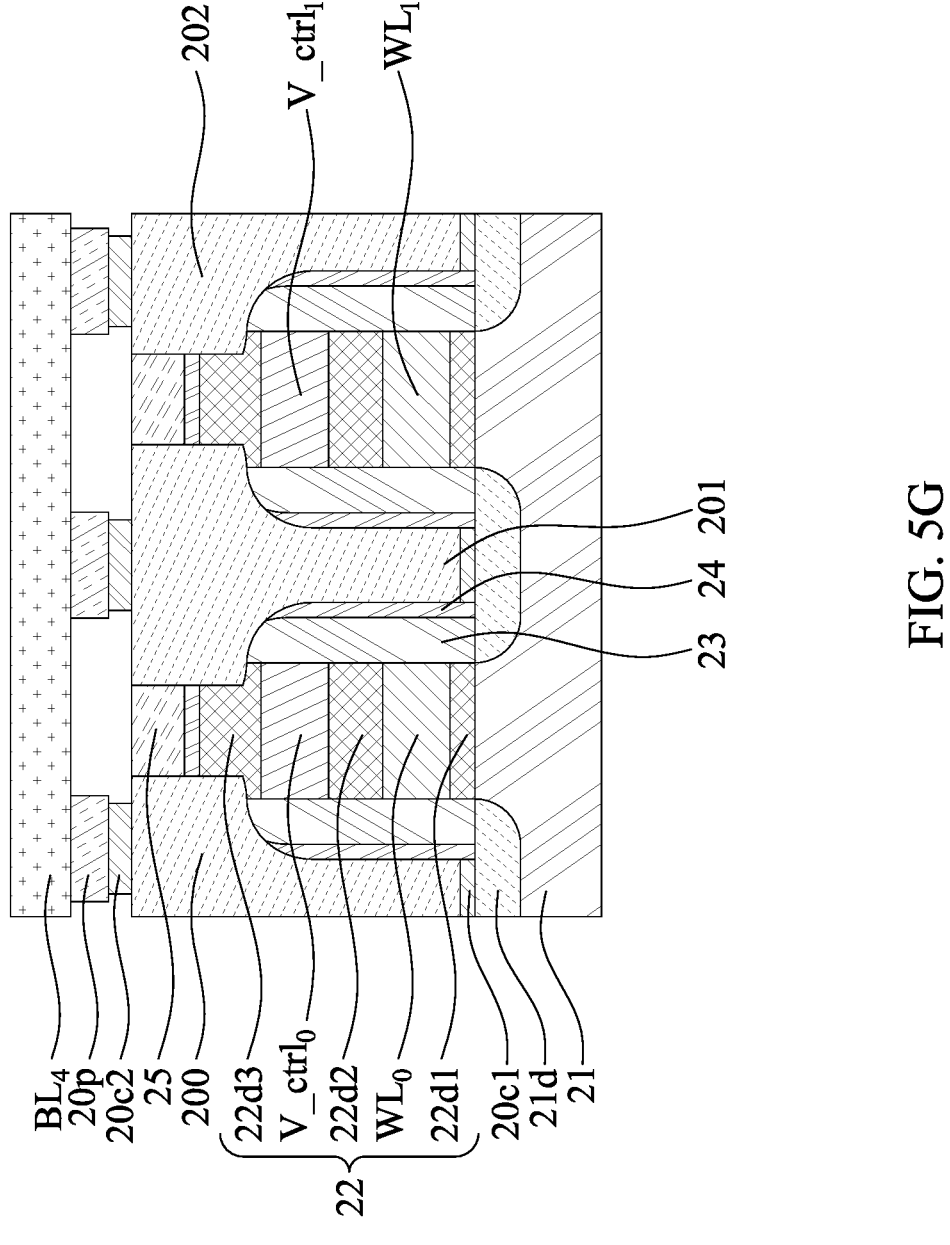
FIG. 5G illustrates one or more stages of a method of manufacturing a semiconductor device in accordance with some embodiments of the present disclosure.

Referring to FIG. 5G, the channel 200 may be formed in the openings 25*h* by operations similar to the operations in FIG. 3D. In some embodiments, subsequent to the formation of the channel 200, the bit-line $BL_4$ may be formed over the channel 200. In some embodiments, a plurality of wiring layers and interlayer insulating films may be formed over the channel 200.

One aspect of the present disclosure provides a semiconductor device. The semiconductor device includes a first bit-line extending in a first direction and a first word-line extending in a second direction substantially perpendicular to the first direction. The semiconductor device also includes a first channel. The first bit-line and the first word-line are electrically coupled to the first channel. The semiconductor device also includes a first gate line disposed between the first bit-line and the first word-line. The first gate line is electrically coupled to the first channel and configured to close the first channel once the first bit-line and the first word-line are shorted together.

Another aspect of the present disclosure provides a semiconductor device. The semiconductor device includes a first bit-line extending in a first direction and a first gate line extending in a second direction substantially perpendicular to the first direction. The semiconductor device also includes a second gate line extending in the second direction. The semiconductor device also includes a first channel disposed between the first gate line and the second gate line. The first gate line is electrically coupled to the first channel and configured to close the first channel once the first bit-line and the first word-line are shorted together.

Another aspect of the present disclosure provides a method of manufacturing a semiconductor device. The method includes providing a substrate and forming a first gate stack on the substrate. The first gate stack includes a first word-line and a first gate line over the first word-line. The method also includes forming a first channel in the first gate stack and forming a bit-line over the first gate line.

By using a gate line disposed between a word-line and a bit-line, a control voltage may be supplied to one or more access transistors for closing channel(s) of the one or more access transistors once a short-circuit occurs between the bit-line and the word-line through the channel(s).

Therefore, the functions of the other channels connected by the bit-line may not be affected. More channels may be activated by a single bit-line. The effective read/write performance of the semiconductor device can be increased by allowing more data to be written to/read from the semiconductor device during a single operation.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:

a first bit-line extending in a first direction;

a first word-line extending in a second direction substantially perpendicular to the first direction;

a first channel, wherein the first bit-line and the first word-line are electrically coupled to the first channel;

a first gate line disposed between the first bit-line and the first word-line, wherein the first gate line is electrically coupled to the first channel and configured to close the first channel once the first bit-line and the first word-line are shorted together through the first channel; wherein the first channel penetrates the first gate line and the first word-line; wherein the first channel terminates at the first word-line;

a second bit-line extending in the first direction;

a second channel, wherein the first word-line and the second bit-line are electrically coupled to the second channel, wherein the first gate line is configured to close the first channel without closing the second channel;

a second word-line extending in the second direction; and a third channel, wherein the second word-line and the first bit-line are electrically coupled to the third channel.

2. The semiconductor device of claim 1, wherein the first channel and the second channel are aligned.

3. The semiconductor device of claim 1, wherein the first channel and the third channel are not aligned.

4. The semiconductor device of claim 1, further comprising:

a second gate line disposed between the first bit-line and the second word-line, wherein the second gate line is electrically coupled to the third channel and configured to close the third channel once the first bit-line and the second word-line are shorted together through the third channel.

5. The semiconductor device of claim 1, further comprising:

a landing pad disposed between the first channel and the first bit-line.

6. The semiconductor device of claim 5, wherein the landing pad defines a concave corner.

7. The semiconductor device of claim 6, wherein the first channel terminates at the first word-line.

8. The semiconductor device of claim 1, wherein the first channel penetrates a gate stack comprising the first gate line and the first word-line.

9. The semiconductor device of claim 1, wherein an aspect ratio of the first channel is greater than about 13.

\* \* \* \* \*